(12) United States Patent
Yamagishi et al.

(10) Patent No.: US 6,744,437 B2
(45) Date of Patent: *Jun. 1, 2004

(54) DATA PROCESSING APPARATUS HAVING DRAM INCORPORATED THEREIN

(75) Inventors: Kazushige Yamagishi, Higashimurayama (JP); Jun Sato, Musashino (JP); Takashi Miyamoto, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/284,153

(22) Filed: Oct. 31, 2002

(65) Prior Publication Data

US 2003/0048274 A1 Mar. 13, 2003

Related U.S. Application Data

(62) Division of application No. 09/961,262, filed on Sep. 25, 2001, which is a division of application No. 09/142,923, filed on Sep. 18, 1998, now Pat. No. 6,295,074.

(51) Int. Cl.[7] .............................................. G06F 15/76
(52) U.S. Cl. ..................... 345/519; 345/536; 345/531; 365/222; 711/105
(58) Field of Search ................. 345/501, 519, 345/539, 536, 545, 564, 570, 531, 530; 365/189.01–189.09, 230.01–230.05, 222; 711/105, 100, 154

(56) References Cited

U.S. PATENT DOCUMENTS

| 4,725,987 A | 2/1988 | Cates | 365/220 |
| 4,796,231 A | 1/1989 | Pinkham | 365/189.01 |
| 5,038,297 A | 8/1991 | Hannah | 345/422 |
| 5,089,987 A | * | 2/1992 | Nakao et al. | 365/222 |

(List continued on next page.)

FOREIGN PATENT DOCUMENTS

| EP | 0649100 | 4/1995 |
| JP | 58-91590 | 1/1983 |
| JP | 5-242257 | 9/1993 |
| JP | 6-60640 | 6/1994 |
| JP | 6-208632 | 7/1994 |
| JP | 7-160249 | 6/1995 |
| JP | 8-212185 | 8/1996 |
| WO | 93/01565 | 1/1993 |
| WO | 95/35572 | 6/1995 |

OTHER PUBLICATIONS

IEEE Computer Society, "Development of a high bandwidth merged logic/DRAM multimedia chip", Luk et al., 12–15, Oct. 1997, p.p. 279–285.

(List continued on next page.)

Primary Examiner—Kee M. Tung
(74) Attorney, Agent, or Firm—Antonelli, Terry, Stout & Kraus, LLP

(57) ABSTRACT

The present invention can be introduced to an architecture such as a personal computer or an amusement equipment for realizing a high-speed graphic processing. In the case where a frame buffer, a command memory and an image processor are integrated in one chip in order to improve the drawing performance of an image processing device, each of the frame buffer and the command memory is constructed by a plurality of identical memory modules and the same row address is allotted to each memory module, thereby increasing the memory address depth. Thereby, it is possible to realize an incorporated frame buffer and an incorporated command memory each of which has a large capacity when seen from the image processor.

9 Claims, 26 Drawing Sheets

U.S. PATENT DOCUMENTS

| | | | |
|---|---|---|---|
| 5,148,524 A | | 9/1992 | Harlin et al. ............... 345/515 |
| 5,293,347 A | | 3/1994 | Ogawa .................. 365/230.01 |
| 5,303,364 A | | 4/1994 | Mayer et al. ............... 711/100 |
| 5,442,588 A | * | 8/1995 | Runas ........................ 365/222 |
| 5,471,592 A | | 11/1995 | Gove et al. ................. 710/132 |
| 5,544,306 A | | 8/1996 | Deering et al. |
| 5,568,445 A | | 10/1996 | Park et al. .................. 365/233 |
| 5,572,655 A | | 11/1996 | Tuljapurkar et al. |
| 5,650,955 A | | 7/1997 | Puar et al. |
| 5,655,105 A | | 8/1997 | McLaury |
| 5,767,865 A | | 6/1998 | Inoue et al. |
| 5,777,608 A | * | 7/1998 | Lipovski et al. ............ 345/519 |
| 6,108,015 A | | 8/2000 | Cross |

OTHER PUBLICATIONS

ISSCC 98, "A 33GB/s 13.4 MB integrated graphics accelerator and frame buffer" Feb. 7, 1998 pp. 1–3.

Nikkei Electronics, Apr. 10, 1995, p. 17.

Nikkei Microdevices, Mar., 1996, p.p. 46–65.

"3D CG media chip: an experimental single–chip architecture for 3D computer graphics" by Watanabe et al., IEICE Trans. Electron., vol. E77–C, No. 12, Dec. 1994, pp. 1881–1887.

* cited by examiner

FIG.2
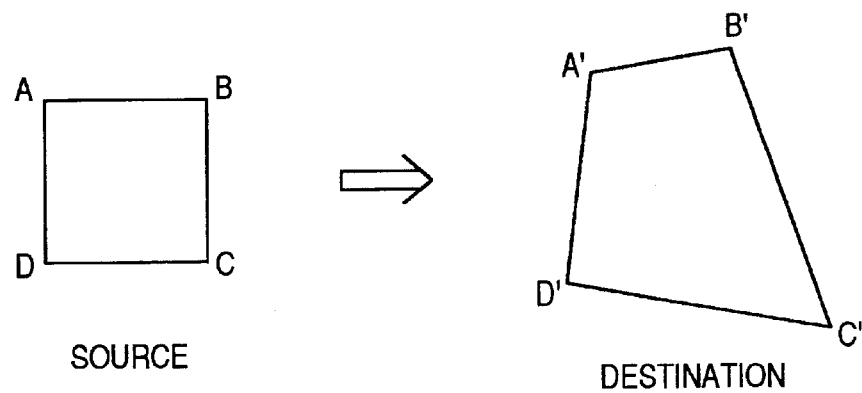
(a)
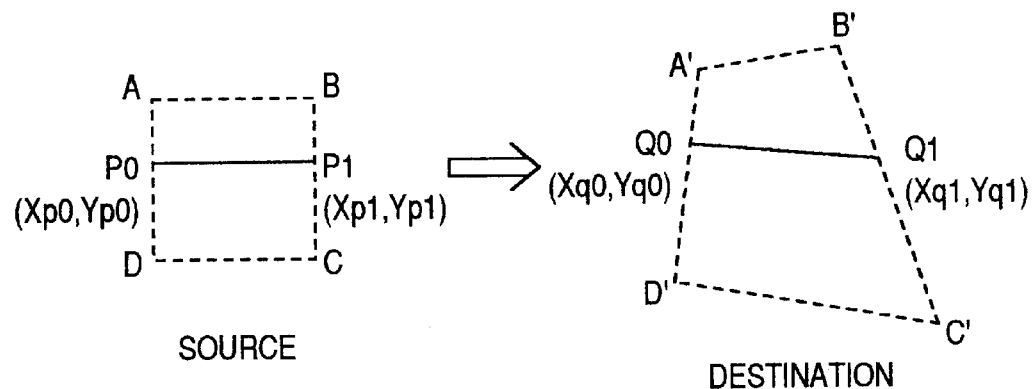
(b)

13.1896mm+0.201mm×2=13.5916mm≒
13.60mm
6.6616mm+0.201mm×2=7.0636mm≒7.07mm
13.60mm×7.07mm=96.152mm² →9.81mm☐

| | SN | ST |
|---|---|---|
| NORMAL OPERATION MODE | 1 | 0 |
| MEMORY TEST MODE | 0 | 1 |
| LOGIC TEST MODE | 1 | 1 |

FIG.18

| TEST MODE | TEST CONTROL PIN | | | | INTERNAL CONTROL SIGNAL | | | | | | | | | | | TEST MODULE | | | | | | REMARKS |
|---|---|---|---|---|---|---|---|---|---|---|---|---|---|---|---|---|---|---|---|---|---|---|
| | TE | | | | TEM | | | | | | | | | | TL | M5 | M4 | M3 | M2 | M1 | M0 | |
| | 3 | 2 | 1 | 0 | 5 | 4 | 3 | 2 | 1 | 0 | | | | | | | | | | | | |
| NORMAL | 0 | 0 | 0 | 0 | 0 | 0 | 0 | 0 | 0 | 0 | 1 | | | | | | | | | | O | |
| LOGIC TEST | 0 | 0 | 0 | 1 | 0 | 0 | 0 | 0 | 0 | 1 | 1 | | | | | | | | | O | | |
| | 0 | 0 | 1 | 0 | 0 | 0 | 0 | 0 | 1 | 0 | 1 | | | | | | | | O | | | |
| | 0 | 0 | 1 | 1 | 0 | 0 | 0 | 1 | 0 | 0 | 1 | | | | | | | O | | | | |
| | 0 | 1 | 0 | 0 | 0 | 0 | 1 | 0 | 0 | 0 | – | | | | | | O | | | | | |
| | 0 | 1 | 0 | 1 | 0 | 1 | 0 | 0 | 0 | 0 | – | | | | | | | O | | | | | |
| | 0 | 1 | 1 | 0 | – | – | – | – | – | – | – | | | | | | | | | | | | |
| | 0 | 1 | 1 | 1 | – | – | – | – | – | – | – | | | | | | | | | | | | |
| STNBY | 1 | 0 | 0 | 0 | 0 | 0 | 0 | 0 | 0 | 0 | 0 | | | | | | | | | | | |
| MEMORY TEST | 1 | 0 | 0 | 1 | 0 | 0 | 0 | 0 | 0 | 1 | 0 | | | | | | | | | | O | MEM ALL OPEN |
| | 1 | 0 | 1 | 0 | 0 | 0 | 0 | 0 | 1 | 0 | 0 | | | | | | | | | O | | |
| | 1 | 0 | 1 | 1 | 0 | 0 | 0 | 1 | 0 | 0 | 0 | | | | | | | | O | | | |
| | 1 | 1 | 0 | 0 | 0 | 0 | 1 | 0 | 0 | 0 | 0 | | | | | | | O | | | | |
| | 1 | 1 | 0 | 1 | 0 | 1 | 0 | 0 | 0 | 0 | 0 | | | | | | O | | | | | |
| | 1 | 1 | 1 | 0 | 1 | 0 | 0 | 0 | 0 | 0 | 0 | | | | | | | | | | | |
| | 1 | 1 | 1 | 1 | – | – | – | – | – | – | – | | | | | | | | | | | |

FIG.21a

| GROUP | ITEM NUMBER | PIN NAME | UNDER NORMAL OPERATION MODE | |
|---|---|---|---|---|
| | | | I/O | CONTENT |
| GP | 1 | MCLK | I | CLOCK 26.8/28.6MHz |
| | 2 | RESETN | I | RESET |
| | 3 | CSN | I | CHIP SELECT |
| | 4 | ADN | I | ADDRESS/DATA SELECT |
| | 5 | DTEN | I | DATA ENABLE |
| | 6 | READYN | O | READY |
| | 7 | IRQN | O | INTERRUPT |
| | 8 | VBUS[0] | I/O | ADDRESS/DATA BUS [0] |
| | 9 | VBUS[1] | I/O | ADDRESS/DATA BUS [1] |
| | 10 | VBUS[2] | I/O | ADDRESS/DATA BUS [2] |
| | 11 | VBUS[3] | I/O | ADDRESS/DATA BUS [3] |
| | 12 | VBUS[4] | I/O | ADDRESS/DATA BUS [4] |
| | 13 | VBUS[5] | I/O | ADDRESS/DATA BUS [5] |
| | 14 | VBUS[6] | I/O | ADDRESS/DATA BUS [6] |
| | 15 | VBUS[7] | I/O | ADDRESS/DATA BUS [7] |
| | 16 | VBUS[8] | I/O | ADDRESS/DATA BUS [8] |
| | 17 | VBUS[9] | I/O | ADDRESS/DATA BUS [9] |
| | 18 | VBUS[10] | I/O | ADDRESS/DATA BUS [10] |
| | 19 | VBUS[11] | I/O | ADDRESS/DATA BUS [11] |
| | 20 | VBUS[12] | I/O | ADDRESS/DATA BUS [12] |
| | 21 | VBUS[13] | I/O | ADDRESS/DATA BUS [13] |
| | 22 | VBUS[14] | I/O | ADDRESS/DATA BUS [14] |
| | 23 | VBUS[15] | I/O | ADDRESS/DATA BUS [15] |
| | 24 | VTIMN | I | v-SYNC SIGNAL |
| | 25 | HTIMN | I | h-SYNC SIGNAL |
| | 26 | VOUT[0] | I/O | DISPLAY START ADDRESS/DISPLAY DATA[0] |
| | 27 | VOUT[1] | I/O | DISPLAY START ADDRESS/DISPLAY DATA[1] |
| | 28 | VOUT[2] | I/O | DISPLAY START ADDRESS/DISPLAY DATA[2] |
| | 29 | VOUT[3] | I/O | DISPLAY START ADDRESS/DISPLAY DATA[3] |
| | 30 | VOUT[4] | I/O | DISPLAY START ADDRESS/DISPLAY DATA[4] |
| | 31 | VOUT[5] | I/O | DISPLAY START ADDRESS/DISPLAY DATA[5] |
| | 32 | VOUT[6] | I/O | DISPLAY START ADDRESS/DISPLAY DATA[6] |
| | 33 | VOUT[7] | I/O | DISPLAY START ADDRESS/DISPLAY DATA[7] |
| | 34 | V2CLK | O | DISPLAY SYNC CLOCK |

FIG. 21b

| GROUP | ITEM NUMBER | MEMORY TEST | | | UNDER TEST MODE | | | LOGIC TEST |
|---|---|---|---|---|---|---|---|---|
| | | PIN NAME | I/O | CONTENT | | PIN NAME | I/O | CONTENT |
| GP | 1 | TECLK | I | MEMORY CLOCK | | MCLK | I | CLOCK 26.8/28.6MHz |
| | 2 | AC | I | ACTIVE CONTROL | | RESETN | I | RESET |
| | 3 | CR | I | ROW ADDRESS CONTROL | | CSN | I | CHIP SELECT |
| | 4 | CC | I | COL ADDRESS CONTROL | | ADN | I | ADDRESS/DATA SELECT |
| | 5 | RW | I | READ/WRITE | | DTEN | I | DATA ENABLE |
| | 6 | | | | | READYN | O | READY |
| | 7 | | | | | IRQN | O | INTERRUPT |
| | 8 | DQ[0] | I/O | MEMORY DATA BUS [0] | | VBUS[0] | I/O | ADDRESS/DATA BUS [0] |
| | 9 | DQ[1] | I/O | MEMORY DATA BUS [1] | | VBUS[1] | I/O | ADDRESS/DATA BUS [1] |
| | 10 | DQ[2] | I/O | MEMORY DATA BUS [2] | | VBUS[2] | I/O | ADDRESS/DATA BUS [2] |
| | 11 | DQ[3] | I/O | MEMORY DATA BUS [3] | | VBUS[3] | I/O | ADDRESS/DATA BUS [3] |
| | 12 | DQ[4] | I/O | MEMORY DATA BUS [4] | | VBUS[4] | I/O | ADDRESS/DATA BUS [4] |
| | 13 | DQ[5] | I/O | MEMORY DATA BUS [5] | | VBUS[5] | I/O | ADDRESS/DATA BUS [5] |
| | 14 | DQ[6] | I/O | MEMORY DATA BUS [6] | | VBUS[6] | I/O | ADDRESS/DATA BUS [6] |
| | 15 | DQ[7] | I/O | MEMORY DATA BUS [7] | | VBUS[7] | I/O | ADDRESS/DATA BUS [7] |
| | 16 | DQ[8] | I/O | MEMORY DATA BUS [8] | | VBUS[8] | I/O | ADDRESS/DATA BUS [8] |
| | 17 | DQ[9] | I/O | MEMORY DATA BUS [9] | | VBUS[9] | I/O | ADDRESS/DATA BUS [9] |
| | 18 | DQ[10] | I/O | MEMORY DATA BUS [10] | | VBUS[10] | I/O | ADDRESS/DATA BUS [10] |
| | 19 | DQ[11] | I/O | MEMORY DATA BUS [11] | | VBUS[11] | I/O | ADDRESS/DATA BUS [11] |
| | 20 | DQ[12] | I/O | MEMORY DATA BUS [12] | | VBUS[12] | I/O | ADDRESS/DATA BUS [12] |
| | 21 | DQ[13] | I/O | MEMORY DATA BUS [13] | | VBUS[13] | I/O | ADDRESS/DATA BUS [13] |
| | 22 | DQ[14] | I/O | MEMORY DATA BUS [14] | | VBUS[14] | I/O | ADDRESS/DATA BUS [14] |
| | 23 | DQ[15] | I/O | MEMORY DATA BUS [15] | | VBUS[15] | I/O | ADDRESS/DATA BUS [15] |
| | 24 | | | | | VTIMN | I | v-SYNC SIGNAL |
| | 25 | | | | | HTIMN | I | h-SYNC SIGNAL |
| | 26 | | | | | VOUT[0] | I/O | DISPLAY START ADDRESS/DISPLAY DATA[0] |
| | 27 | | | | | VOUT[1] | I/O | DISPLAY START ADDRESS/DISPLAY DATA[1] |
| | 28 | | | | | VOUT[2] | I/O | DISPLAY START ADDRESS/DISPLAY DATA[2] |
| | 29 | | | | | VOUT[3] | I/O | DISPLAY START ADDRESS/DISPLAY DATA[3] |
| | 30 | | | | | VOUT[4] | I/O | DISPLAY START ADDRESS/DISPLAY DATA[4] |
| | 31 | | | | | VOUT[5] | I/O | DISPLAY START ADDRESS/DISPLAY DATA[5] |
| | 32 | | | | | VOUT[6] | I/O | DISPLAY START ADDRESS/DISPLAY DATA[6] |
| | 33 | | | | | VOUT[7] | I/O | DISPLAY START ADDRESS/DISPLAY DATA[7] |
| | 34 | | | | | V2CLK | O | DISPLAY SYNC CLOCK |

FIG.22a

| TEST CONTROL PIN | | | | | | | | TESTING PIN | | | | | | | | | | | | | | | | | | | | | | | | | | | | |
|---|---|---|---|---|---|---|---|---|---|---|---|---|---|---|---|---|---|---|---|---|---|---|---|---|---|---|---|---|---|---|---|---|---|---|---|---|
| 35 | 36 | 37 | 38 | 39 | 40 | 41 | | 42 | 43 | 44 | 45 | 46 | 47 | 48 | 49 | 50 | 51 | 52 | 53 | 54 | 55 | 56 | 57 | 58 | 59 | 60 | 61 | 62 | 63 | 64 | 65 | 66 | 67 | 68 | 69 | 70 | 71 |
| TEC[0] | TEC[1] | TEC[2] | TEC[3] | T[0] | T[1] | T[2] | | | | | | | | | | | | | | | | | | | | | | | | | | | | | | | |
| TEST MODULE SELECT[0] | TEST MODULE SELECT[1] | TEST MODULE SELECT[2] | TEST MODULE SELECT[3] | TEST DATA SELECT[0] | TEST DATA SELECT[1] | TEST DATA SELECT[2] | | | | | | | | | | | | | | | | | | | | | | | | | | | | | | | |

FIG.22b

| | | | | | | |
|---|---|---|---|---|---|---|
| TEST CONTROL PIN | 35 | TEC[0] | I | TEST MODULE SELECT[0] | TEC[0] | I | TEST MODULE SELECT[0] |
| | 36 | TEC[1] | I | TEST MODULE SELECT[1] | TEC[1] | I | TEST MODULE SELECT[1] |
| | 37 | TEC[2] | I | TEST MODULE SELECT[2] | TEC[2] | I | TEST MODULE SELECT[2] |
| | 38 | TEC[3] | I | TEST MODULE SELECT[3] | TEC[3] | I | TEST MODULE SELECT[3] |
| | 39 | T[0] | I | TEST DATA SELECT[0] | T[0] | I | TEST DATA SELECT[0] |
| | 40 | T[1] | I | TEST DATA SELECT[1] | T[1] | I | TEST DATA SELECT[1] |
| | 41 | T[2] | I | TEST DATA SELECT[2] | T[2] | I | TEST DATA SELECT[2] |
| TESTING PIN | 42 | TEADR[0] | I | MEMORY ADDRESS BUS[0] | LTEAD[0] | O | VDP1 ADDRESS BUS[0] |
| | 43 | TEADR[1] | I | MEMORY ADDRESS BUS[1] | LTEAD[1] | O | VDP1 ADDRESS BUS[1] |
| | 44 | TEADR[2] | I | MEMORY ADDRESS BUS[2] | LTEAD[2] | O | VDP1 ADDRESS BUS[2] |
| | 45 | TEADR[3] | I | MEMORY ADDRESS BUS[3] | LTEAD[3] | O | VDP1 ADDRESS BUS[3] |
| | 46 | TEADR[4] | I | MEMORY ADDRESS BUS[4] | LTEAD[4] | O | VDP1 ADDRESS BUS[4] |
| | 47 | TEADR[5] | I | MEMORY ADDRESS BUS[5] | LTEAD[5] | O | VDP1 ADDRESS BUS[5] |
| | 48 | TEADR[6] | I | MEMORY ADDRESS BUS[6] | LTEAD[6] | O | VDP1 ADDRESS BUS[6] |
| | 49 | TEADR[7] | I | MEMORY ADDRESS BUS[7] | LTEAD[7] | O | VDP1 ADDRESS BUS[7] |
| | 50 | TEADR[8] | I | MEMORY ADDRESS BUS[8] | LTEAD[8] | O | VDP1 ADDRESS BUS[8] |
| | 51 | TEADR[9] | I | MEMORY ADDRESS BUS[9] | LTEAD[9] | O | VDP1 ADDRESS BUS[9] |
| | 52 | TEADR[10] | I | MEMORY ADDRESS BUS[10] | LTEAD[10] | O | VDP1 ADDRESS BUS[10] |
| | 53 | TERC[0] | I | MEMORY BANK ADDRESS[R0] | LTERC[0] | O | VDP1 BANK ADDRESS[R0] |
| | 54 | TERC[1] | I | MEMORY BANK ADDRESS[R1] | LTERC[1] | O | VDP1 BANK ADDRESS[R1] |
| | 55 | TERC[2] | I | MEMORY BANK ADDRESS[R2] | LTERC[2] | O | VDP1 BANK ADDRESS[R2] |
| | 56 | TERC[3] | I | MEMORY BANK ADDRESS[R3] | LTERC[3] | O | VDP1 BANK ADDRESS[R3] |
| | 57 | TERC[4] | I | MEMORY BANK ADDRESS[R4] | LTERC[4] | O | VDP1 BANK ADDRESS[R4] |
| | 58 | TERC[5] | I | MEMORY BANK ADDRESS[R5] | LTERC[5] | O | VDP1 BANK ADDRESS[R5] |
| | 59 | TERC[6] | I | MEMORY BANK ADDRESS[R6] | LTERC[6] | O | VDP1 BANK ADDRESS[R6] |
| | 60 | TERC[7] | I | MEMORY BANK ADDRESS[R7] | LTERC[7] | O | VDP1 BANK ADDRESS[R7] |
| | 61 | TERC[8] | I | MEMORY BANK ADDRESS[C0] | AC | O | ACTIVE CONTROL |
| | 62 | TERC[9] | I | MEMORY BANK ADDRESS[C1] | CR | O | ROW ADDRESS CONTROL |
| | 63 | TERC[10] | I | MEMORY BANK ADDRESS[C2] | CC | O | COL ADDRESS CONTROL |
| | 64 | TERC[11] | I | MEMORY BANK ADDRESS[C3] | RW | O | READ/WRITE |
| | 65 | TERC[12] | I | MEMORY BANK ADDRESS[C4] | LTEBE[0] | O | VDP1 BYTE ENABLE[0] |
| | 66 | TERC[13] | I | MEMORY BANK ADDRESS[C5] | LTEBE[1] | O | VDP1 BYTE ENABLE[1] |
| | 67 | TERC[14] | I | MEMORY BANK ADDRESS[C6] | LTEBE[2] | O | VDP1 BYTE ENABLE[2] |
| | 68 | TERC[15] | I | MEMORY BANK ADDRESS[C7] | LTEBE[3] | O | VDP1 BYTE ENABLE[3] |
| | 69 | TEBE[0] | I | MEMORY BYTE ENABLE[0] | LTED[0] | O | VDP1 DATA BUS[0] |
| | 70 | TEBE[1] | I | MEMORY BYTE ENABLE[1] | LTED[1] | O | VDP1 DATA BUS[1] |
| | 71 | TEBE[2] | I | MEMORY BYTE ENABLE[2] | LTED[2] | O | VDP1 DATA BUS[2] |

FIG.23a

| TESTING PIN | 72 | | |
| --- | --- | --- | --- |
| | 73 | | |
| | 74 | | |
| | 75 | | |
| | 76 | | |
| | 77 | | |
| | 78 | | |
| | 79 | | |
| | 80 | | |
| | 81 | | |
| | 82 | | |
| | 83 | | |
| | 84 | | |
| POWER PIN | 85 | VCC | POWER |
| | 86 | VCC | POWER |
| | 87 | VCC | POWER |
| | 88 | VCC | POWER |
| | 89 | VCC | POWER |
| | 90 | VCC | POWER |
| | 91 | VCC | POWER |
| | 92 | VCC | POWER |
| | 93 | GND | GROUND |
| | 94 | GND | GROUND |
| | 95 | GND | GROUND |
| | 96 | GND | GROUND |
| | 97 | GND | GROUND |
| | 98 | GND | GROUND |
| | 99 | GND | GROUND |
| | 100 | GND | GROUND |

FIG.23b

| TESTING PIN | | | | | | |
|---|---|---|---|---|---|---|
| | 72 | TEBE[3] | | MEMORY BYTE ENABLE[3] | LTED[3] | O | VDP1 DATA BUS[3] |
| | 73 | TEBE[4] | | MEMORY BYTE ENABLE[4] | LTED[4] | O | VDP1 DATA BUS[4] |
| | 74 | TEBE[5] | | MEMORY BYTE ENABLE[5] | LTED[5] | O | VDP1 DATA BUS[5] |
| | 75 | TEBE[6] | | MEMORY BYTE ENABLE[6] | LTED[6] | O | VDP1 DATA BUS[6] |
| | 76 | TEBE[7] | | MEMORY BYTE ENABLE[7] | LTED[7] | O | VDP1 DATA BUS[7] |
| | 77 | TEBE[8] | | MEMORY BYTE ENABLE[8] | LTED[8] | O | VDP1 DATA BUS[8] |
| | 78 | TEBE[9] | | MEMORY BYTE ENABLE[9] | LTED[9] | O | VDP1 DATA BUS[9] |
| | 79 | TEBE[10] | | MEMORY BYTE ENABLE[10] | LTED[10] | O | VDP1 DATA BUS[10] |
| | 80 | TEBE[11] | | MEMORY BYTE ENABLE[11] | LTED[11] | O | VDP1 DATA BUS[11] |
| | 81 | TEBE[12] | | MEMORY BYTE ENABLE[12] | LTED[12] | O | VDP1 DATA BUS[12] |
| | 82 | TEBE[13] | | MEMORY BYTE ENABLE[13] | LTED[13] | O | VDP1 DATA BUS[13] |
| | 83 | TEBE[14] | | MEMORY BYTE ENABLE[14] | LTED[14] | O | VDP1 DATA BUS[14] |
| | 84 | TEBE[15] | | MEMORY BYTE ENABLE[15] | LTED[15] | O | VDP1 DATA BUS[15] |
| POWER PIN | 85 | VCC | I | POWER | VCC | I | POWER |
| | 86 | VCC | I | POWER | VCC | I | POWER |
| | 87 | VCC | I | POWER | VCC | I | POWER |
| | 88 | VCC | I | POWER | VCC | I | POWER |
| | 89 | VCC | I | POWER | VCC | I | POWER |
| | 90 | VCC | I | POWER | VCC | I | POWER |
| | 91 | VCC | I | POWER | VCC | I | POWER |
| | 92 | VCC | I | POWER | VCC | I | POWER |
| | 93 | GND | I | GROUND | GND | I | GROUND |
| | 94 | GND | I | GROUND | GND | I | GROUND |
| | 95 | GND | I | GROUND | GND | I | GROUND |
| | 96 | GND | I | GROUND | GND | I | GROUND |
| | 97 | GND | I | GROUND | GND | I | GROUND |
| | 98 | GND | I | GROUND | GND | I | GROUND |
| | 99 | GND | I | GROUND | GND | I | GROUND |
| | 100 | GND | I | GROUND | GND | I | GROUND |

DATA PROCESSING APPARATUS HAVING DRAM INCORPORATED THEREIN

CROSS-REFERENCE TO RELATED APPLICATION

This application is a divisional of U.S. application Ser. No. 09/961,262, filed Sep. 25, 2001, which is a divisional of 09/142,923, filed Sep. 18, 1998, which is now U.S. Pat. No. 6,295,074.

TECHNICAL FIELD

The present invention relates to a semiconductor integrated circuit device, and more particularly to a semiconductor integrated circuit device in which a data processing device for performing an image processing and a memory device for storing image data or instructions are incorporated.

BACKGROUND ART

In recent years, personal computers have pushed into the field of work stations with intent to realize alternate for large-size computers by the network configuration of work stations. Also, an architecture for realizing a low-cost and high-speed graphic processing has recently been needed with the advance of home amusement equipments. In particular, a modified sprite processing for freely mapping source data of rectangles forms the basis of a three-dimensional graphics processing and is expected to have a drawing performance on the order of several ten thousands of polygons per second in order to realize more real display.

In order to improve the drawing performance of graphic LSI, a labor is taken for an improvement in the rate of data transfer between the graphic LSI and a frame buffer. A method for improving the data transfer rate includes (1) a method in which a high-speed interface is used and (2) a method in which a data bus width between the graphic LSI and the frame buffer is enlarged.

In the case of the method (1), the improvement in data transfer rate is realized using a DRAM provided with a high-speed page mode or a synchronous DRAM. The method using the synchronous DRAM is disclosed by JP-A-7-160249.

In the case of the method (2), the improvement in data transfer rate is realized by incorporating a frame buffer and a graphics controller in one chip with 128 bits or the like as the bit width of an internal bus. An example having a DRAM and a graphics controller incorporated in one chip is disclosed by "DEVELOPMENT OF GRAPHIC LSI HAVING FRAME BUFFER INCORPORATED THEREIN", Nikkei Electronics, p. 17 (Apr. 10, 1995) and "ONE-CHIP IMPLEMENTATION WITH LOGIC—DRAM FORMS CORE OF SYSTEM", Nikkei Microdevice, pp. 44–65 (March, 1996).

In the frame buffer incorporated graphic LSI disclosed by Nikkei Electronics, a portion of a 16-Mbit general purpose standard DRAM corresponding to 9 Mbits is removed and thereinstead replaced by a logic circuit including a controller. Regarding a DRAM incorporated graphic controller disclosed by Nikkei Microdevice, this reference has no specific disclosure excepting that the DRAM is incorporated.

DISCLOSURE OF INVENTION

However, in the case where the general purpose standard DRAM or the like is modified to incorporate the frame buffer in the graphic LSI as in the above-mentioned prior art, a restriction is imposed on the arrangement of a graphic controller since the mat construction of the memory, the input/output direction of data and so forth are determined by the specification of the general purpose standard DRAM. Also, unnecessary drawing-around of wiring is caused in order to provide an interface with the graphic controller.

Namely, in the case where the conventional general purpose standard DRAM or synchronous DRAM is incorporated as it is, it is difficult to obtain the optimum chip size. Also, since the graphic controller is filled in a vacant space of the DRAM, it becomes impossible to use a macro cell of the existing graphic controller as it is.

Further, the incorporation of the DRAM results in that a bus for making an access by the graphic controller to the DRAM does not appear on the external side. Accordingly, it becomes impossible to employ the conventional test method. Namely, in the case of the conventional separate-chip construction in which a graphic controller and an image memory such as a frame buffer are provided on separate chips, the direct detection from terminals of the image memory is possible upon physical fault of the connection terminals of the graphic controller and the image memories and even upon functional fault thereof. On the other hand, in the case of a one-chip construction in which a graphic controller and a image memory are provided on one chip, it will be impossible to directly monitor communication of information with terminals of the image memory.

An object of the present invention is to realize the optimum layout of a semiconductor integrated circuit device in which an image memory and an image processor are incorporated.

Another object of the present invention is to allow a semiconductor integrated circuit device with a logic and a memory incorporated therein to use the conventional test method for test of the memory as it is.

A further object of the present invention is to realize an incorporated image memory having an increased memory address depth and a capacity which is large when seen from an image processor.

A furthermore object of the present invention is to facilitate the control logic of a state machine of a logic of a semiconductor integrated circuit device in which the logic and a memory are incorporated.

The summary of typical ones of inventions disclosed by the present application will be mentioned in the following.

A a semiconductor integrated circuit device having an image memory and an image processor incorporated therein is arranged along the flow of information.

Also, a semiconductor integrated circuit device is provided with a test bus for an incorporated memory to allow the output to the exterior. Further, the incorporated memory is provided with a normal port and a test port.

Also, each of image memories incorporated in a semiconductor integrated circuit device is constructed by a plurality of identical memory modules each of which is allotted with the same row address.

Also, in the case where a logic incorporated in a semiconductor integrated circuit device makes an access to a memory, the latency of a memory read operation and that of a memory write operation are made equal to each other.

BRIEF DESCRIPTION OF DRAWINGS

FIG. 2 shows a typical one of an image operation.

FIG. 18 shows the allotment of test control pins of the semiconductor integrated circuit device according to the present invention.

FIGS. 21a, 21b, 22a, 22b, 23a and 23b show input/output pins of the semiconductor integrated circuit device according to the present invention.

BEST MODE FOR CARRYING OUT THE INVENTION

The present invention will be explained in accordance with the accompanying drawings in order to make more detailed description of the invention.

Figure 1:
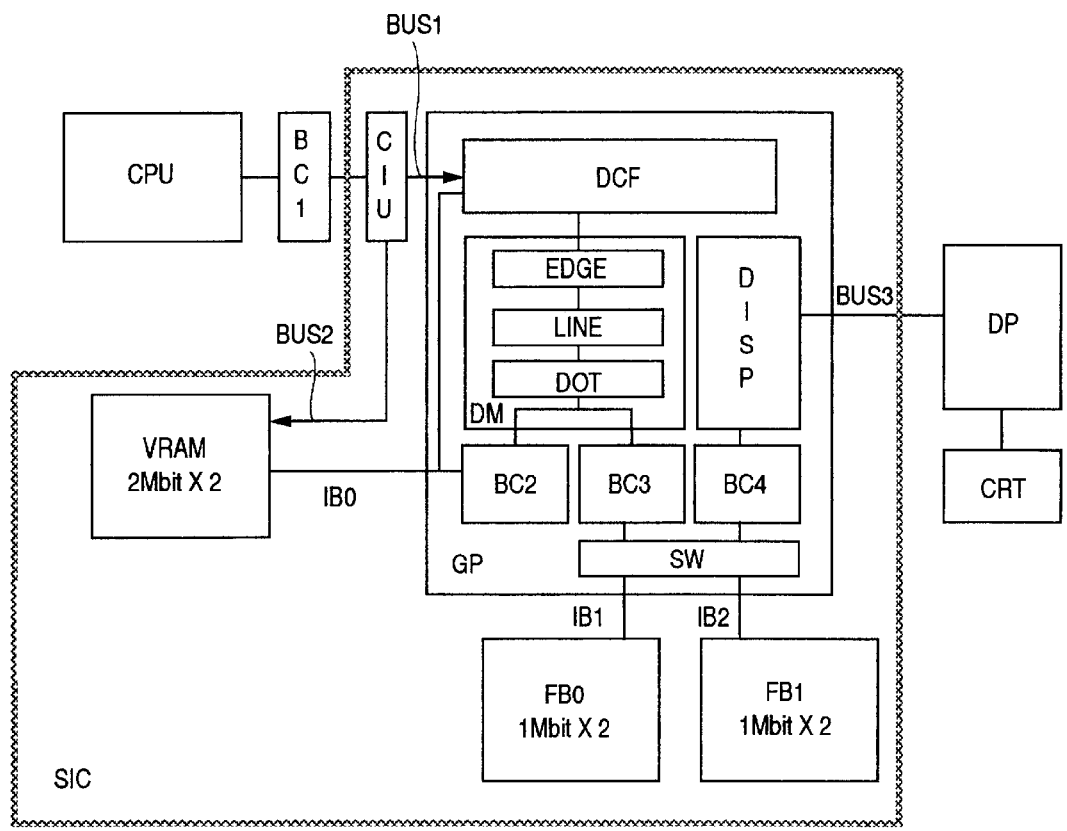
FIG. 1 shows an example of a system which uses a semiconductor integrated circuit device according to the present invention.

FIG. 1 shows an example of a system which uses a semiconductor integrated circuit device according to an embodiment the present invention. The system shown in FIG. 1 forms a part of a data processing system such as a personal computer or an amusement equipment.

A semiconductor integrated circuit device SIC is composed of an image processor GP, a command/source data image memory (hereinafter referred to as command memory) VRAM and drawing/display memories (hereinafter referred to as drawing memories) FB0 and FB1. The semi-conductor integrated circuit device SIC is formed on one semiconductor substrate such as a silicon substrate and is resin-sealed (or sealed in a plastic package). The semiconductor integrated circuit device SIC is connected to a central processing unit CPU and a CRT control circuit DP.

The central processing unit CPU makes an access to the image processor GP through a bus control circuit BC1. In the image processor GP, an output from the bus control circuit BC1 divides through the CPU interface unit CIU into a bus BUS1 which makes an access to the drawing command fetch section DCF and a bus BUS2 which makes an access to the command memory VRAM.

In the case where an access is made to the drawing command fetch section DCF from the CPU interface unit CIU, a command and input data to be processed are read from the command memory VRAM and are then supplied to the drawing controller DM, performing image data operation, such as the edge operating section EDGE, the line operating section LINE, the dot operating section DOT and so forth.

More particularly, the drawing command fetch section DCF issues an execution start command to fetch a command from the command memory VRAM, transfers necessary parameters to the edge operating section EDGE, the line operating section LINE and the dot operating section DOT, and activates the edge operating section EDGE. The edge operating section EDGE calculates an input data storing coordinate (or a coordinate at which the input data is stored) and a drawing coordinate in units of one end point and activates the line operating section LINE. The line operating section LINE operates an input data storing coordinate and a drawing coordinate in units of one dot and instructs the dot operating section DOT to perform the processing of data. The dot operating section DOT takes the input data out of the command memory VRAM to process the data. After the processing of the data, the dot operating section DOT performs the drawing into either the drawing memory FB0 or the drawing memory FB1 through the bus controller BC3 and the change-over switch SW. Which one of the drawing memories FB0 and FB1 is the drawing started from, is determined in accordance with a state after resetting.

One of the drawing memories FB0 and FB1 being not subjected to drawing is subjected to a read processing by the display controller DISP through the bus controller BC4 and the change-over switch SW. The display controller DP transfers the read data to the display processor DP through a display output bus BUS3. The display processor DP converts the display data into a video signal and sends the video signal to a display device CRT.

The case where the command memory VRAM is accessed from the CPU interface unit CIU includes the case of the testing of the image processor GP. In this case, an external data processing device such as a logic tester stores a test command into the command memory VRAM through the CPU interface unit CIU. The testing of the image processor GP is performed in such a manner that the image processor GP executes the stored test command on the basis of an instruction from the external data processing device.

The command memory VRAM is constructed by a 4-M (M=1048576) bit dynamic RAM (Random Access Memory hereinafter referred to as DRAM). Each of the image memories FB0 and FB1 is constructed by a 2-Mbit DRAM.

Before the detailed explanation of the image processor GP, description will be made of an image processing. In order to realize an image processing which copes with three dimensions, an image pattern called a texture mapping is put on the surface of an object. This requires a function of mapping a rectangular source pattern to a destination pattern shown by four arbitrary points. This function is called a modified sprite processing. With the incorporation of a predetermined number of small-area image patterns in an image processing device, the patterns are moved on a background image at a high speed. By performing this modified sprite processing, a perspective representation becomes possible so that more real display can be realized.

In mapping the rectangular source pattern to the destination pattern shown by four arbitrary points, it is necessary to perform an image operation including the enlargement, reduction and rotation of the original picture image. A typical one of the image operation is shown in FIG. 2. FIG. 2(a) represents a function of mapping a rectangular source image ABCD to an arbitrary rectangle A'B'C'D'.

The image processor GP uses a system in which this mapping is realized by performing line copy plural times. The line copy corresponds to an image operation in which a row of horizontal dots P0(Xp0, Yp0) to P1(Xp1, Yp1) of the source image are mapped to an arbitrary line from Q0(Xq0, Yq0) to Q1(Xq1, Yq1) on a destination space, as shown in FIG. 2(b). The image processor GP performs an edge operation of determining the start and end points Q0 and Q1 of the line copy and a line operation of determining a line which connects the start point Q0 and the end point Q1. The image processor GP can perform the modified sprite processing at the highest 29 Mdots/sec in accordance with a macro command from the external data processing device.

Figure 3:
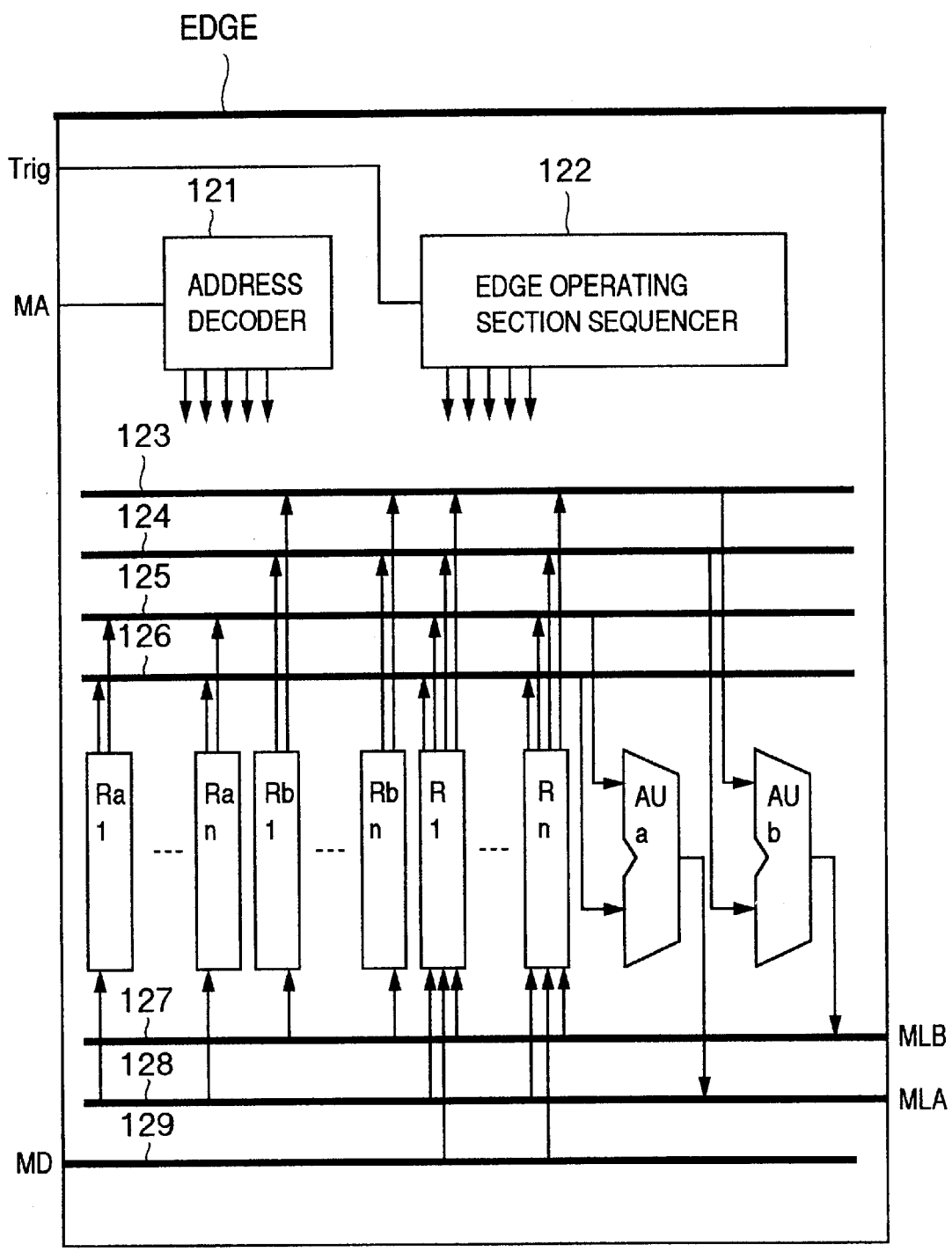
FIG. 3 shows a block diagram of an edge operating section of an image processor incorporated in a semiconductor integrated circuit device according to the present invention.

FIG. 3 shows a detailed block diagram of the edge operating section EDGE. The edge operating section EDGE is composed of two 13-bit arithmetic units AUa and AUb each having dedicated read and write buses, 13-bit registers (R1–Rn) common to the two arithmetic units AUa and AUb, 13-bit registers (Ra1–Ran, Rb1–Rbn) for the exclusive use of the two arithmetic units AUa and AUb, an address decoder 121 for selecting the registers (R1–Rn, Ra1–Ran, Rb1–Rbn), and an edge operating section sequencer 122 for controlling the arithmetic units AUa and AUb and so forth.

The edge operating section EDGE is a module which executes an edge drawing algorithm. Also, the edge operating section EDGE fetches a drawing command, drawing source data and drawing parameters from the command memory VRAM. The fetched command and parameters are stored into internal registers provided in the edge operating section EDGE and the dot operating section DOT. The edge operating section EDGE performs an edge operation in accordance with the fetched drawing command and drawing parameters and stores the result of edge operation an internal register provided in the line operating section LINE.

Figure 4:
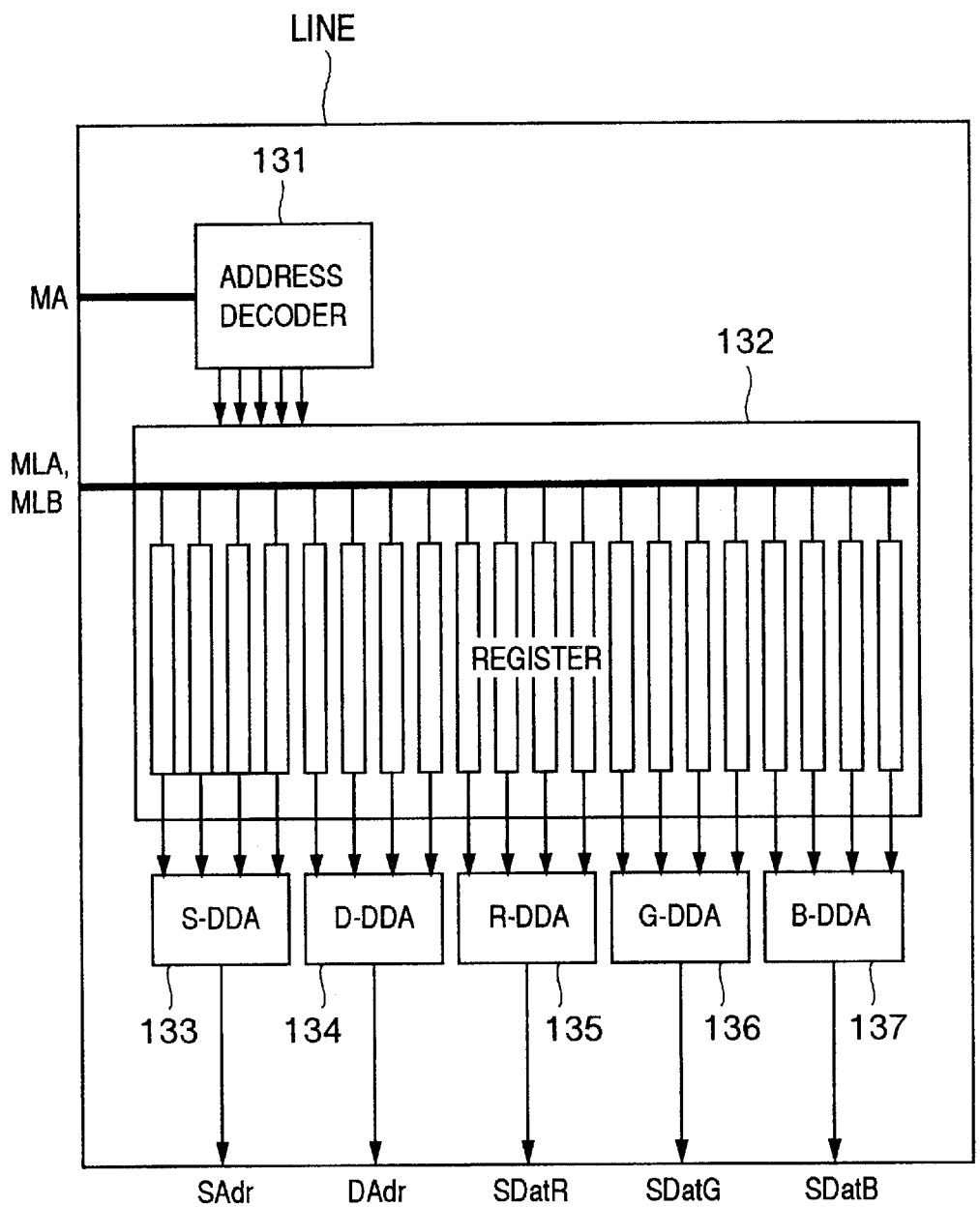
FIG. 4 shows a block diagram of a line operating section of the image processor incorporated in the semiconductor integrated circuit device according to the present invention.

FIG. 4 shows a detailed block diagram of the line operating section LINE. The line operating section LINE is composed of five DDA (Digital Differential Analyzer) arithmetic units (S-DDA, D-DDA, R-DDA, G-DDA, B-DDA) for performing a DDA operation (an operation of mainly performing subtraction) in one cycle, a 13-bit register group 132, an address decoder 131 for selecting the register group 132, and so forth.

The line operating section LINE is a module which executes a line drawing algorithm. The line operating section LINE performs a line operation in accordance with the result of edge operation stored by the edge operating section EDGE. Parameters of the start and end points of a line copy received from the edge operating section EDGE are stored in the register group 132 incorporated in the line operating section LINE. The line operating section LINE performs the line operation on the basis of the stored parameters.

Figure 5:
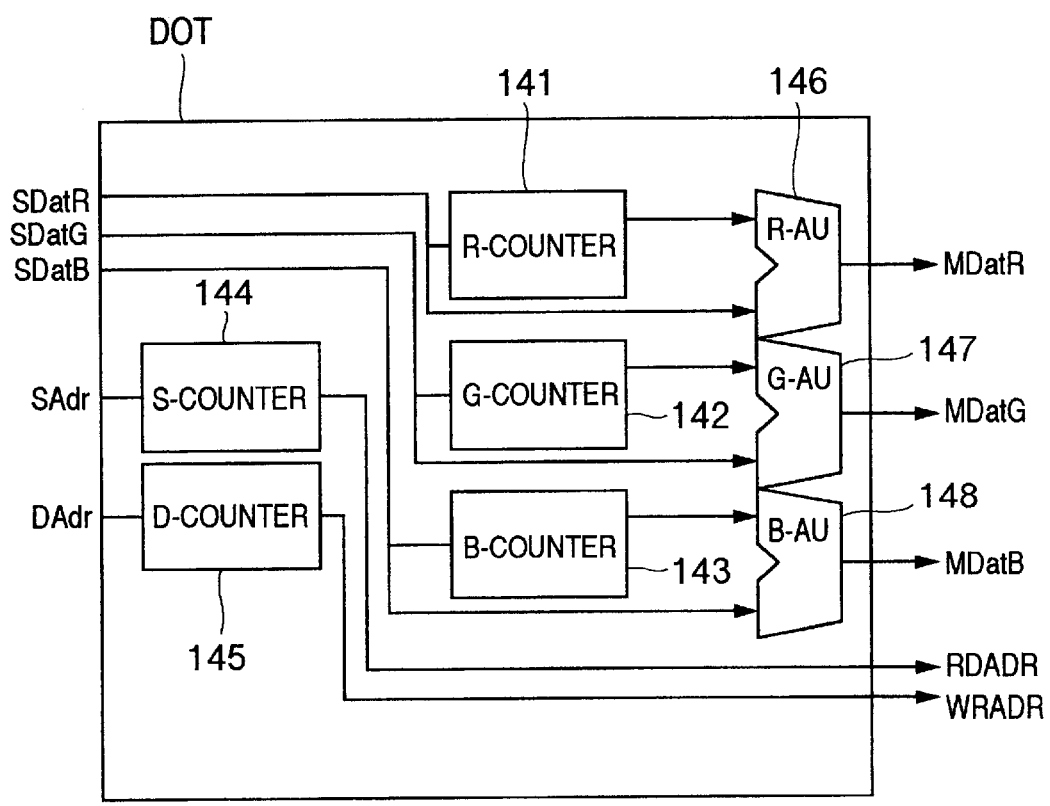
FIG. 5 shows a block diagram of a dot operating section of the image processor incorporated in the semiconductor integrated circuit device according to the present invention.

FIG. 5 shows a detailed block diagram of the dot operating section DOT. The dot operating section DOT is composed of a source memory address counter S-Counter, a destination memory address counter D-Counter, three 5-bit counters R-Counter, G-Counter and B-Counter corresponding to red, green and blue, three 5-bit arithmetic units R-AU, G-AU and B-AU each having dedicated read and write buses, and so forth.

Each of the source memory address counter S-Counter and the destination memory address counter D-Counter makes the count-up of address when a carry is generated as the result of operation. Each of the three 5-bit counters R-Counter, G-Counter and B-Counter makes the count-up of color data when a carry is generated as the result of operation. Each of the three 5-bit arithmetic units R-AU, G-AU and B-AU makes the addition of source data red, green or blue and red, green or blue generated by the 5-bit counter R-Counter, G-Counter or B-Counter.

The dot operating section DOT is a module which executes a dot copy algorithm. The dot operating section DOT performs an address operation and a dot operation of data for the drawing memory in accordance with the result of line operation. The dot operating section DOT performs an access to the command memory VRAM for reading of source data, the dot operation and an access to the drawing memory FB0 or FB1 for writing of the result of dot operation. The dot operation is an operation of determining a source coordinate P of a certain dot on a line copy, a destination coordinate Q thereof and color data (R, G, B) of the destination coordinate Q and is determined by an increment from an initial value.

The display controller DISP reads display data from the drawing memory FB0 or FB1 and sends the read display data to the display processor DP. In the display controller DISP is incorporated a refresh circuit for refreshing the command memory VRAM and the drawing memories FB0 and FB1. The refresh circuit refreshes the command memory VRAM and the drawing memories FB0 and FB1 simultaneously. The refresh cycle is performed in reference to the command memory VRAM.

Usually, in the case where a DRAM is externally mounted to the image processor, the refresh circuit includes a register for refresh cycle in order to cope with various DRAM's. The CPU performs the writing into the refresh cycle register in compliance with the specification of a DRAM or the like, thereby determining a refresh cycle.

In the present embodiment, however, since the image processor GP, the command memory VRAM and the drawing memories FB0 and FB1 are formed on one semiconductor integrated circuit device, the number of refresh cycles and the number of clocks for the command memory VRAM and the drawing memories FB0 and FB1 are known beforehand and can be fixed.

With this construction, clocks conformable to the command memory VRAM are inputted from the display controller DISP to the command memory VRAM and the drawing memory FB0 or FB1, thereby unifying the refresh cycle of the image processing device having a plurality of DRAM's mounted thereon. Also, the display controller DISP can know a flyback period of the display device CRT and therefore performs the refreshing of the DRAM by use of the flyback period.

In the present embodiment, the command memory VRAM uses a 4-Mbit DRAM. Therefore, the drawing memories FB0 and FB1 using 2-Mbit DRAM's are refreshed two times.

Figure 6:
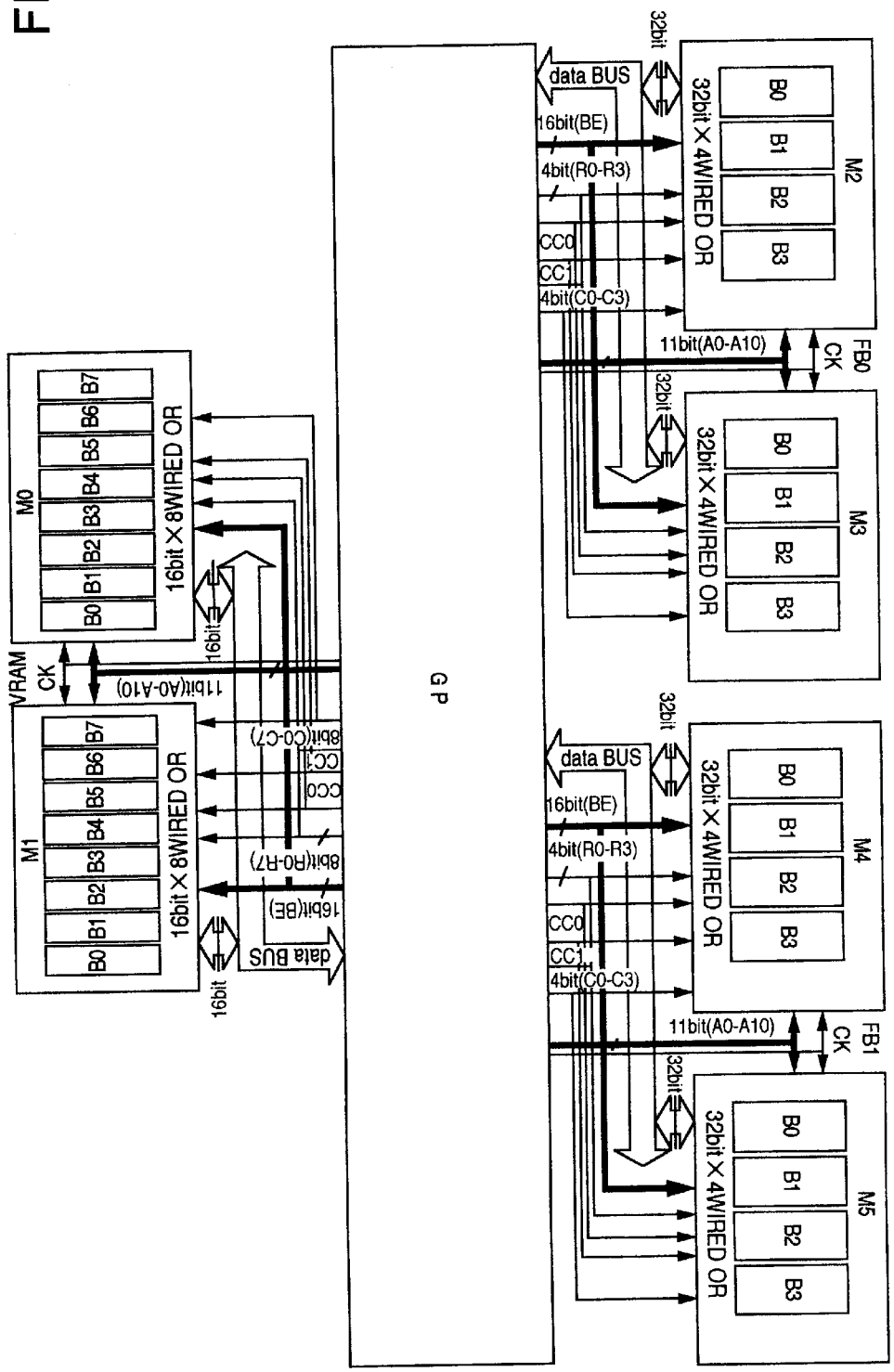
FIG. 6 shows a connection relationship between the image processor and an image memory which are incorporated in the semiconductor integrated circuit device according to the present invention.

FIG. 6 shows a connection relationship of the image processor GP with the command memory VRAM and the drawing memories FB0 and FB1.

The 4-Mbit DRAM of the command memory VRAM is formed using two 2-Mbit DRAM modules of 8-bank construction. Also, each of the 2-Mbit DRAM's of the drawing memories FB0 and FB1 is formed using two 1-Mbit DRAM modules of 4-bank construction. Hereinafter, the DRAM module will also be referred to as memory module.

Each bank of the command memory VRAM and the drawing memories FB0 and FB1 forms a memory array which has 256 word lines and 1024 bit line pairs. A column selecting circuit selects 128 bit line pairs (8 row addresses AX and 3 column addresses AYi). Namely, the bank has a storage capacity of 256 Kbits (K=1024). With the use of this construction, a memory module can be constructed in units of 256 Kbits by increasing and decreasing the number of banks. This memory module is suitable for a semiconductor integrated circuit on which logics and memories are mounted together or in a mixed form, as in the present embodiment.

The selection of a bank in the memory module is made by a row address Ri (i=number of banks) and a column address Ci. Also, a byte enable signal BE enables the input/output of 128-bit data at every n times (n=1 16) as large as 8 bits (or 1 byte).

The memory module is a so-called synchronous type DRAM in which an address signal and a control signal are inputted in synchronism with a clock signal and data is also inputted in synchronism with the clock signal. Accordingly, the memory module operates in accordance with a so-called command designated by the control signal and the address signal. Also, a row address and a column address are not multiplex-inputted as in a general purpose standard DRAM.

Between the image processor GP and the command memory VRAM are connected a 16-bit data bus DBUS16, a 11-bit address bus (A0–A10), and signals which include 8-bit row bank address (R0–R7), 8-bit column bank address (C0–C7), row address control CR, column address control CC0, CC1, 16-bit byte enable BE, read/write RW, active control AC, clock CK and so forth.

Between the image processor GP and the drawing memories FB0 and FB1 are connected a 32-bit data bus DBUS32, a 11-bit address bus (A0–A10), and signals which include 4-bit bank address (R0–R3), row address control CR, column address control CC0, CC1, 16-bit byte enable BE, read/write RW, active control AC, clock CK and so forth.

Figure 7:
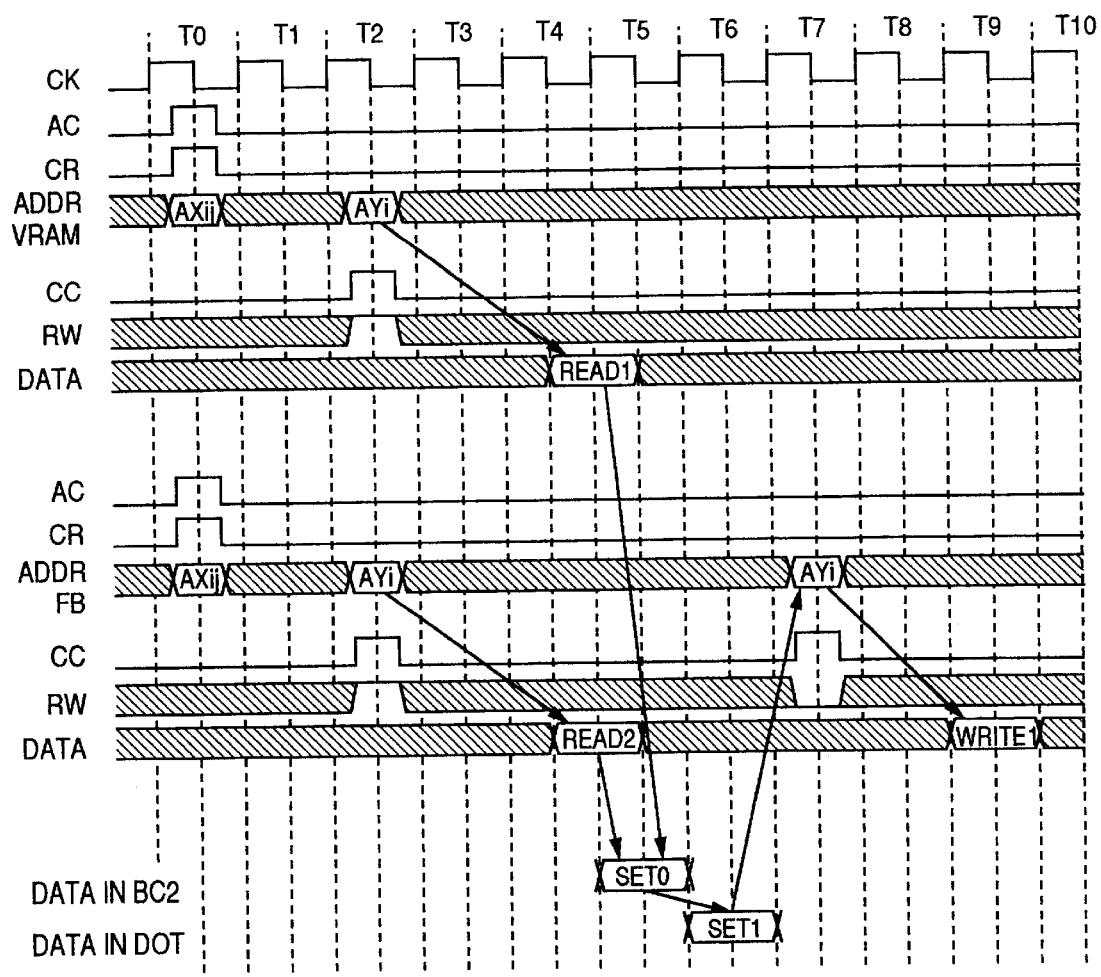
FIG. 7 shows a basic timing chart for reading and writing for a memory module incorporated in the semiconductor integrated circuit device according to the present invention.

FIG. 7 shows the basic timing for reading and writing for the memory module. Namely, there is represented the basic timing which concerns a series of operations including the reading of source data from the command memory VRAM, the image conversion of the source data by the image processor GP and the writing of the image converted data into the drawing memory FB0 or FB1.

An address ADDRVRAM of the command memory VRAM and an address ADDRFB of the drawing memory FB0 or FB1 are generated by the image processor GP and are then inputted to the command memory VRAM and the drawing memory FB0 or FB1, respectively. Also, a control signal necessary for the memory modules is generated by the image processor GP and is then inputted to the command memory VRAM and the drawing memory FB0 or FB1. An active control AC, a row address control CR and a row address AX are taken into the memory module upon falling of a clock signal CK to activate a bank (T0). After two clocks, an address control CC, read/write RW and a column address AYi are taken into the memory module upon falling of the clock signal CK (T2). After further two clocks, data is read (T4).

Namely, source data (READ1) is read after four clocks subsequent to the taking of the row address AX into the command memory VRAM. Similarly, dot data (READ2) is read after four clocks subsequent to the taking of the row address into the drawing memory FB.

In the image processor GP, the source data (READ1) read from the command memory VRAM and the dot data (READ2) read from the drawing memory FB are latched by the bus controller BC2 (SET0) and synthetic data (SET1) is generated by the dot operating section DOT.

Further, the image processor GP outputs an address and a control signal in order to write the synthetic data (SET1) into the drawing memory FB0 or FB1. Address control CC, read/write RW and column address AYi are taken into the memory module upon falling of the clock signal CK (T7). After two clocks, the writing of data (WRITE1) is performed (T9). Thereby, the synthetic data (SET1) is written into the drawing memory FB.

In the present embodiment, the latency of reading from the memory module (or a time from the input of a read command until data can be read) is two clocks and the latency of writing into the memory module (or a time from the input of a write command until data is written) is one clock. Therefore, in the case of writing, the image processor GP inserts NOP for one cycle to match the write cycle and the read cycle with each other. Thereby, it is possible to treat a read processing and a write processing in the state machine without discrimination and it becomes unnecessary to consider the access combinations of read/write, write/read, read/read and write/write in the state machine. Thereby, it is also possible to reduce the number of logic gates of the image processor.

Figure 8:
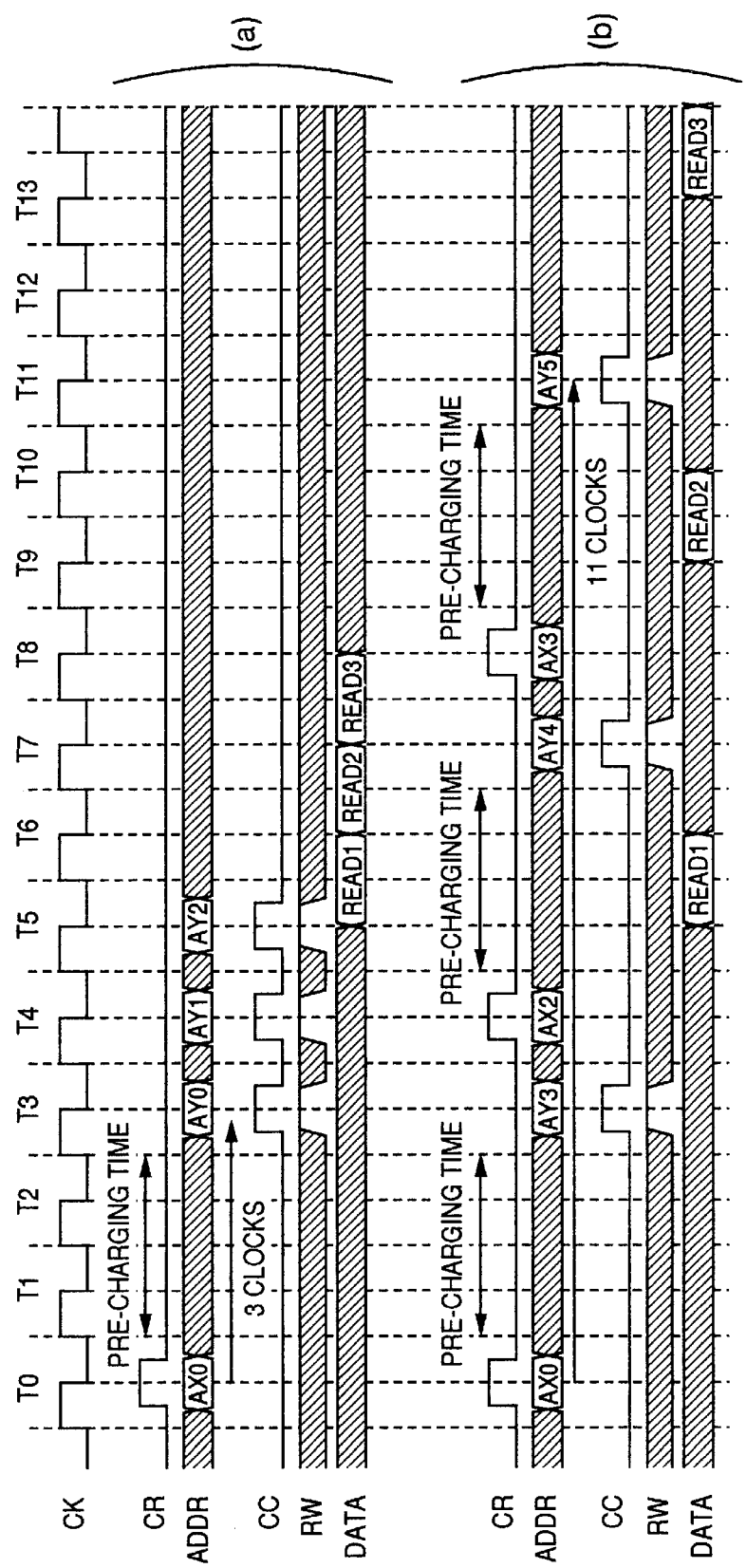
FIG. 8 shows a timing chart in the case where a change-over between row addresses of the memory module incorporated in the semiconductor integrated circuit device according to the present invention is made.
Figure 9:
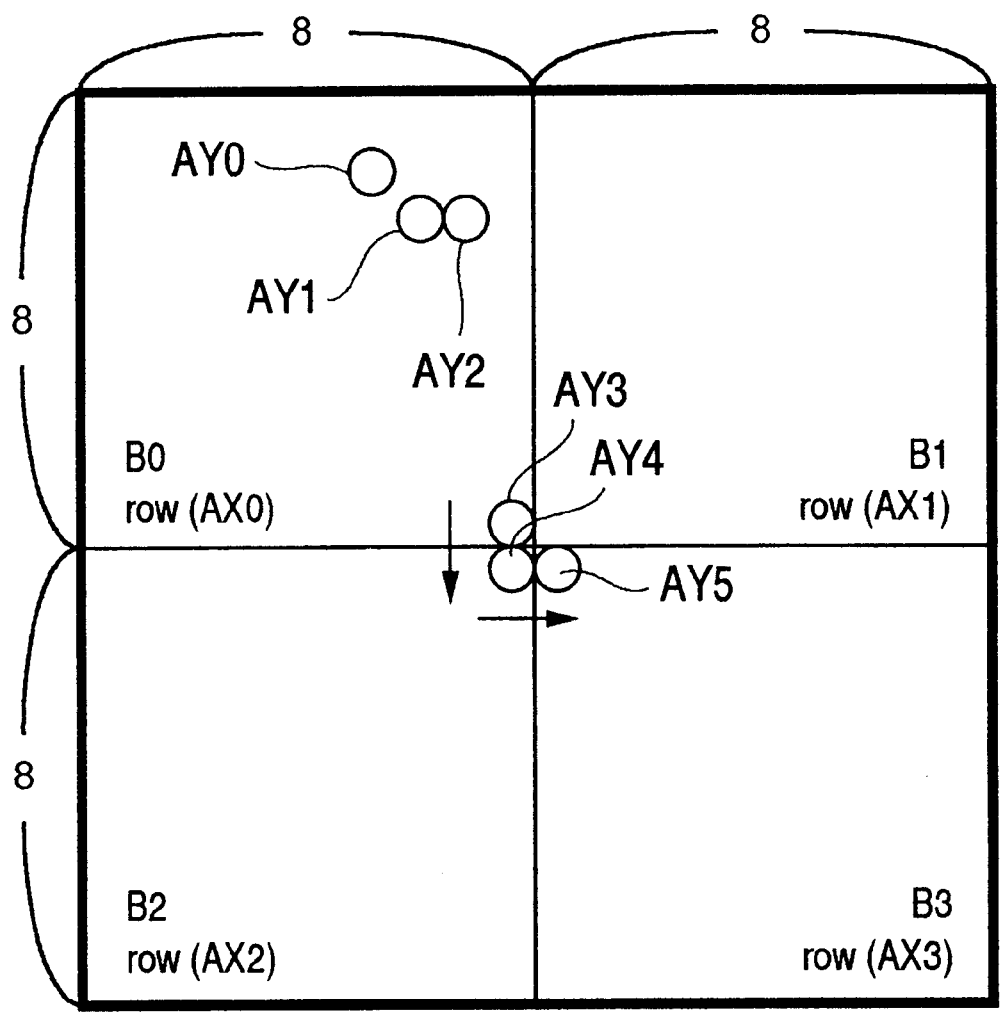
FIG. 9 shows the case where there is generated a drawing which extends over a plurality of banks.

In the case where a change-over between row addresses AX is made, it is necessary to reserve two clocks for a pre-charging time from the supply of a row address AX until the issuance of a column address AY0, as shown in FIG. 8(a). Namely, the column address AY0 is issued after three clocks subsequent to the supply of the row address AX0. In the case where data in the same row address AX0 is to be accessed subsequently, it is possible to issue column addresses AY1 and AY2 continuously. In the case where three dots extending over a plurality of banks are to be drawn, as shown in FIG. 9, it is necessary to reserve two clocks as a pre-charging time from the supply of the row address AX0 until the issuance of a column address AY3, it is necessary to reserve two clocks as a pre-charging time from the supply of a row address AX2 until the issuance of a column address AY4. Namely, it is not possible to continue the issuance of column addresses and eleven clocks are required until the issuance of the third column address AY5, as shown in FIG. 8(b).

Figure 10:
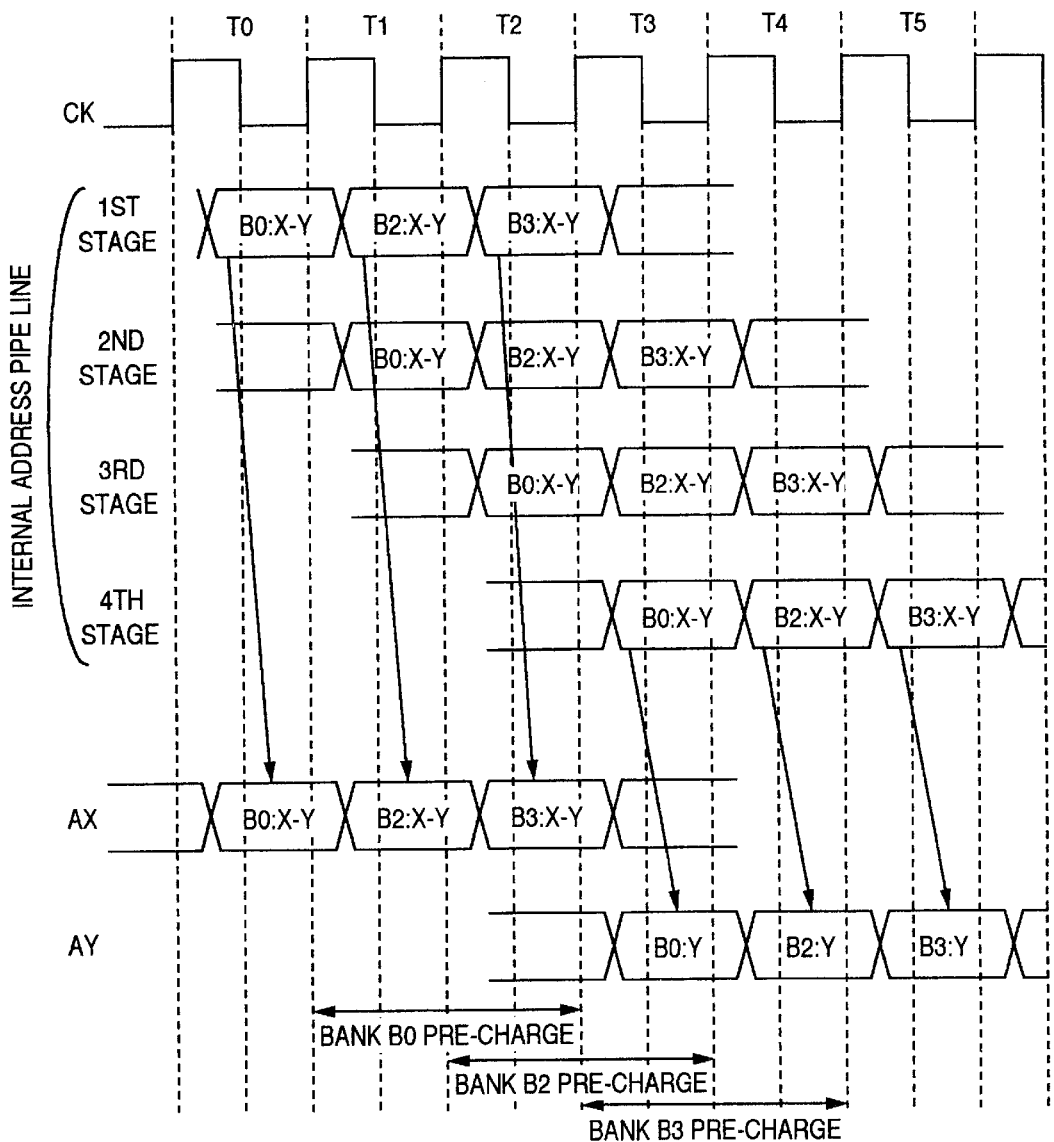
FIG. 10 shows a four-stage pipe-line processing by the image processor incorporated in the semiconductor integrated circuit device according to the present invention.

Thus, it is possible to continue the issuance of column addresses AY apparently by issuing a row address AX three clocks before a change-over between row addresses AX is made. In the present embodiment, this is realized by a 4-stage pipe-line processing as shown in FIG. 10.

First, for a bank B0, a change-over between row addresses AX is detected at a first stage (B0:X-Y) so that a row address (B0:AX0) is issued (T0). In a second stage and a third stage, NOP is performed to ensure a pre-charging time (T1, T2). At a fourth stage, a column address (B0:AY3) is issued (T3).

Next, for a bank B2, a change-over between row addresses AX is detected at the first stage (B2:X-Y) so that a row address (B2:AX1) is issued (T1). In the second stage and the third stage, NOP is performed to ensure a pre-charging time (T2, T3). At the fourth stage, a column address (B2:AY4) is issued (T4).

Next, for a bank B3, a change-over between row addresses AX is detected at the first stage (B3:X-Y) so that a row address (B3:AX1) is issued (T2). In the second stage and the third stage, NOP is performed to ensure a pre-charging time (T3, T4). At the fourth stage, a column address (B3:AY5) is issued (T5).

By thus performing the 4-stage pipe-line processing, the column addresses of the three banks can be issued continuously. Thereby, in a usual state of use, the performance is improved corresponding to the absence of a wait caused by a mishit cycle.

The detection of change-over between row addresses AX can be realized by comparing a row address AX of the preceding cycle and a row address AX of the present cycle by a comparator in the bus controller BC2, BC3 or BC4.

The reason why two memory modules are used for each of the command memory VRAM and the image memories FB0 and FB1, is that the same row address AX is inputted to the two memory modules simultaneously to double the number of bits accessed by the same row address AX. This reason will be explained in the following.

In the memory module of the present embodiment, the number of bits capable of being made active by the row address issuance performed once is 1024 bits. In the case where data existing at the same row address AX is to be accessed (hitting), a read command or write command can be issued immediately. However, in the case where an access is to be made to data which do not exist at the same row address AX (mishitting), the read command or write command cannot be issued immediately in order to ensure a pre-charging time.

If the same row address is allotted to the two memory modules and the row address is inputted to those modules simultaneously, the row address access performed once enables the activation of 2048 bits which are two times as compared with the case where the row address is inputted to one module. In this case, column address control CC uses one characteristic of each memory module. In the present embodiment, two column address controls CC0 and CC1 are used to select columns.

In the case of mishitting, the image processor GP takes three clock cycles to make two banks of the two memory modules active. Namely, a plurality of banks are made active simultaneously, thereby reducing overhead at the time of bank change-over.

In the case where four memory modules are used for each of the command memory VRAM and the image memories FB0 and FB1, the command memory uses a 1M memory module and each of the image memories FB0 and FB1 uses a 512K memory module. In this case, the row address access performed once enables the activation of 4096 bits which are four times as compared with the case where the row address is inputted to one module.

If a row address AX is being hit in the memory module of the present embodiment, a read or write processing can be performed continuously by outputting only column addresses AY. However, when the row address AX is mishit, a row address is issued after pre-charging. Therefore, it is necessary to take a wait of several cycles for the issuance of a command. Accordingly, if a mishitting is generated at the time of writing of destination data during a period of time when source data is being read without mishitting, there results in the overflow and extinction of data. In the present embodiment, therefore, the mishitting at the time of writing is detected in advance to wait for data by causing a mishitting operation even if the reading on the source data side is not mishit. Inversely, if the reading on the source data side is mishit, the mishitting operation is also performed at the time of writing on the destination side.

Figure 11:
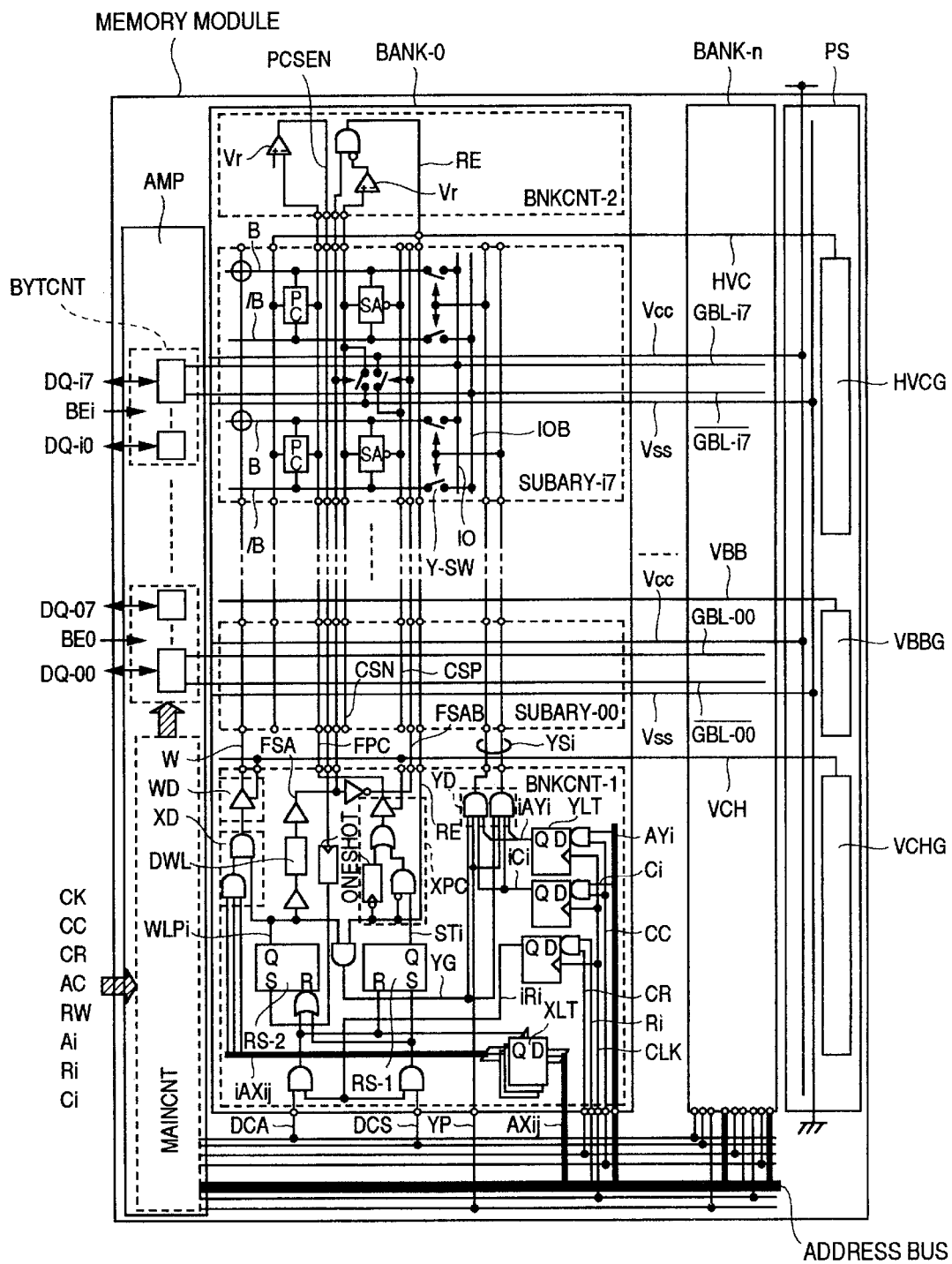
FIG. 11 shows a specific example of the memory module incorporated in the semiconductor integrated circuit device according to the present invention.

FIG. 11 shows a specific construction of the memory module in the present embodiment. The memory module is composed of three kinds of modules including a bank module BANK, an amplifier module AMP and a power supply module PS. FIG. 11 shows the memory module in a form resembling to the actual layout.

The bank module BANK includes BANK-0 to BANK-n and is composed of a plurality of submemory arrays SUBARY (BUBARY-00 to SUBARY-i7), a bank control circuit BNKCNT-1 and a bank control circuit BNKCNT-2.

The submemory array SUBARY includes a plurality of pairs of bit lines B and /B, a plurality of word lines W, a plurality of memory cells (represented by circular symbol in the figure), a bit line pre-charging circuit PC for bringing the potential of the bit line into a predetermined level before reading from the memory cell, a sense amplifier SA for amplifying a signal from the memory cell, a Y selecting circuit for selecting one of the plurality of pairs of bit lines B and /B, and global bit lines GBL and /GBL for connecting the selected bit lines B and /B to an amplifier module AMP. The submemory array SUBARY is a divisional unit of I/O line in the bank module BANK.

The bank control circuit BNKCNT-1 includes an X decoder XD for selecting the word line W, a Y decoder YD for selecting the bit lines B and /B, and so forth. Receiving a bank address and a control signal which will be mentioned later on, the bank control circuit BNKCNT-1 automatically generates signals necessary for a series of memory cell read operations including the pre-charging of bit line, the selection of word line, the activation of sense amplifier, and so forth. One word line W is selected by the X decoder XD, and (8×i) pairs of (n×8×i) pairs of bit lines B and /B (n=8 in the present embodiment though the case of n=2 is shown in FIG. 11 for restriction by the size of drawing) intersecting the selected word line W are selected by an output signal YSi of the Y decoder YD. The selected bit lines B and /B makes the delivery and reception of data to and from the amplifier module AMP through the global bit lines GBL and /GBL arranged parallel to the bit lines B and /B.

The bank control circuit BNKCNT-2 includes a group of sensors for detecting the reaching of a sense amplifier control signal to a certain level.

The amplifier module AMP is composed of a main control circuit MAINCNT for supplying a control signal, an address signal and so forth to the bank module BANK in synchronism with a clock signal, and a byte control circuit BYTCNT for controlling the reading and writing of data for the group of bank modules (BANK-0 to BANK-n). Through the amplifier module AMP, (8×i) data input/output lines DQ (DQ00, - - - , DQ07, - - - , DQ07, - - - , DQi7) from the exterior of the memory module are inputted to the memory cells. A byte control signal BEi is a signal for turning the data input/output lines DQ on and off in units of one byte.

The power supply module PS is a module for generating various voltages and includes a VCH generating circuit VCHG for generating a word line voltage VCH (higher than a power supply voltage VCC) supplied to the bank module BANK and necessary for a word line driving circuit WD, a bit line pre-charge voltage generating circuit HVCG for generating a voltage HVC (equal to one half of the power supply voltage VCC) necessary for pre-charging the bit lines, an in-array substrate voltage generating circuit VBBG for generating an in-array substrate voltage (or a back bias voltage) VBB (lower than a power supply voltage VSS (or ground potential)), and so forth.

The bank module BANK of the present embodiment includes 256 word lines. One word line intersects (8×8×i) pairs of bit lines the one-eighth of which is selected to the Y decoder so that (8×i) pairs of global lines are inputted and outputted. In the present embodiment, i is 16 so that one bank module BANK has a capacity of 256 Kbits and is inputted and outputted with data with a 128 bit width. Namely, there is obtained a memory macro module the capacity of which is variable with the size of 256 Kbit unit. The bank module BANK-n corresponds to one of the plurality of banks B0 to B7 shown in FIG. 6.

Figure 12:
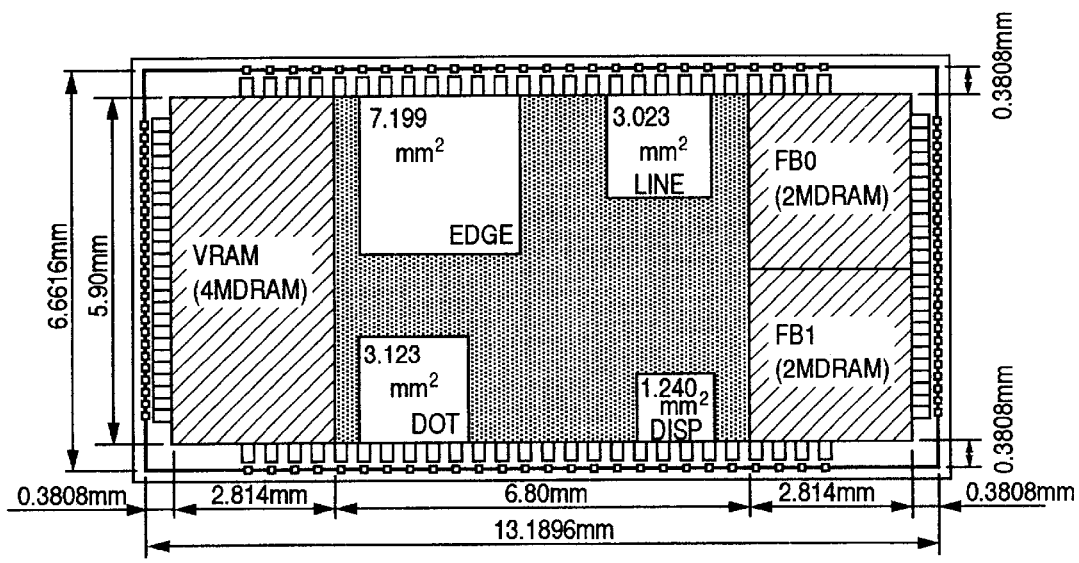
FIG. 12 shows a schematic construction of a layout image of the semiconductor integrated circuit device according to the present invention.

The schematic construction of the layout image of the semiconductor integrated circuit SIC according to the present invention is shown in FIG. 12. The semiconductor integrated circuit SIC has a laterally elongated form which has the command memory VRAM arranged on the left side thereof and the drawing memories FB0 and FB1 arranged on the right side thereof. The image processor GP is arranged between the left and right sides.

Figure 13:
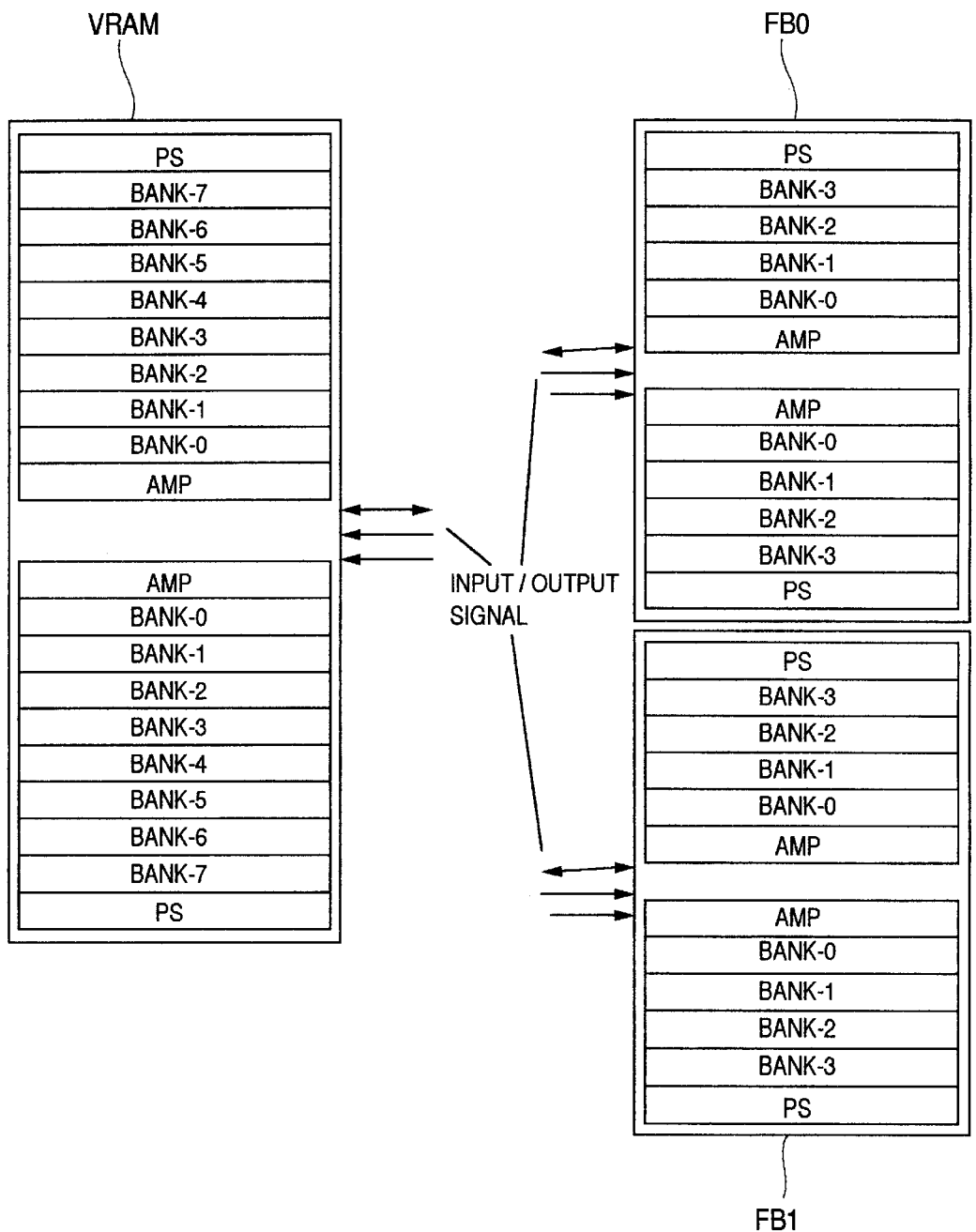
FIG. 13 shows an example of the layout of memory modules incorporated in the semiconductor integrated circuit device according to the present invention.

An example of the layout of memory modules is shown in FIG. 13. The command memory VRAM has two mirror-symmetrically arranged 2-Mbit memory modules so that an address bus, a data bus, a control signal and so forth are inputted and outputted from a space between the two memory modules. Each of the drawing memories FB0 and FB1 has two mirror-symmetrically arranged 1-Mbit memory modules so that an address bus, a data bus, a control signal and so forth are inputted and outputted from a space between the two memory modules.

Figure 14:
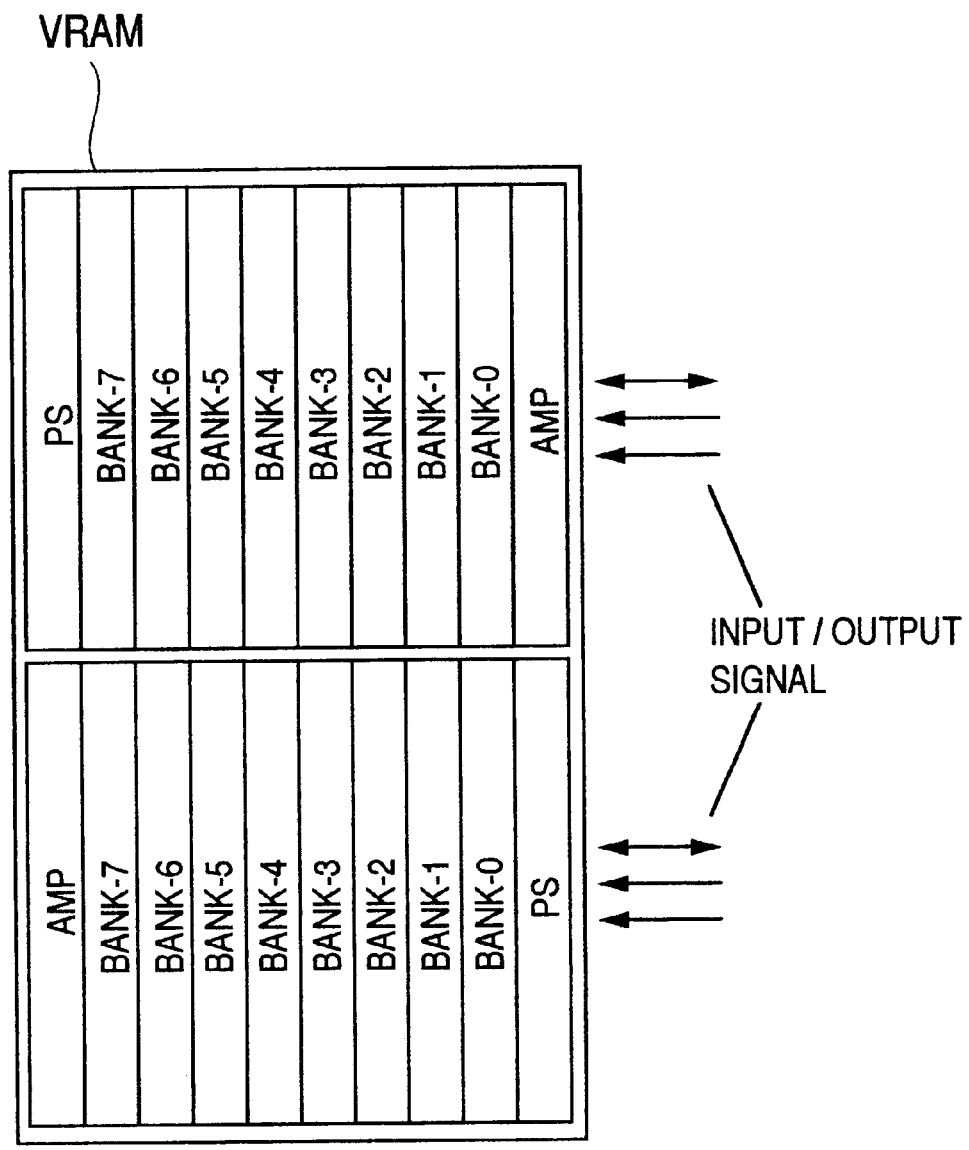
FIG. 14 shows another example of the layout of memory modules incorporated in the semiconductor integrated circuit device according to the present invention.

In the present embodiment, a bus width between the image processor GP and the memory module is 16 bits or 32 bits or relatively small. Since the memory module has a 128-bit width at the largest, it is possible to enlarge the bus width between the image processor GP and the memory module to 128 bits. In that case, the change of arrangement of memory modules as shown in FIG. 14 facilitates the provision of a data input/output interface.

The command memory VRAM and the drawing memories FB0 and FB1 have the same storage capacity and are different in the manner of construction of memory modules but the power supply module and the amplifier module are small as compared with the bank module. Accordingly, the command memory VRAM and the drawing memories FB0 and FB1 can be provided substantially with the same form and the same area. Namely, though the command memory VRAM and the drawing memories FB0 and FB1 are shown in FIG. 13 to have different sizes, an actual difference in size therebetween is not so large.

According to the present embodiment, the exchange of information is made along a flow from the command memory VRAM to the drawing command fetch section DCF, the edge operating section EDGE, the line operating section LINE, the dot operating section DOT, the drawing memories FB0 and FB1, the display controller DISP, the drawing memories FB0 and FB1, and the display controller DISP. Namely, information flows from the left of FIG. 12 to the right thereof. Therefore, the drawing-around of wiring becomes simple and the length of wiring becomes short. Also, the wiring area is reduced, thereby reducing the chip area. Further, since the wiring length becomes short, signal delay becomes small, thereby enabling a high-speed operation.

Figure 15:
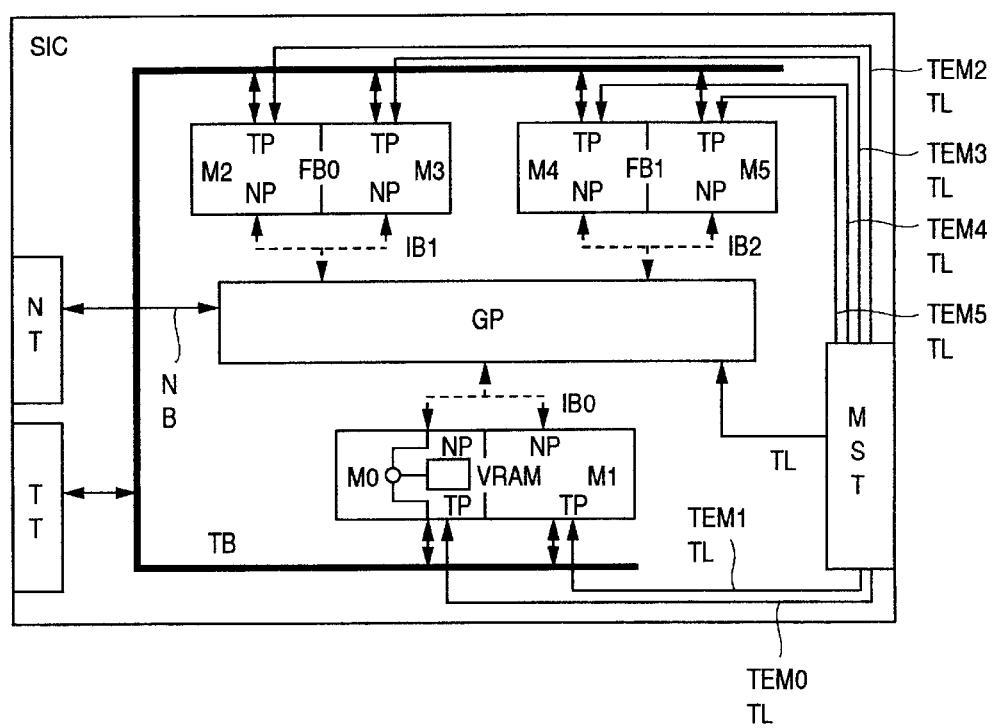
FIG. 15 shows a test mechanism of the semiconductor integrated circuit device according to the present invention.

FIG. 15 shows a block diagram of the interior of the semiconductor integrated circuit device SIC of the present invention concerning a test mechanism.

The semiconductor integrated circuit device SIC is provided with a normal bus NB connected to the image processor GP and used at the time of normal operation, a normal terminal NT connected to the normal bus NB, a common test bus TB connected to the image processor GP, the command memory VRAM and the drawing memories FB0 and FB1 and used at the time of test operation, a test terminal TT connected to the common test bus TB, and a mode selecting terminal MST for controlling modes including a normal mode, a test mode and so forth. Module selecting signals TEM0~5 are signals outputted from the mode selecting terminal MST for selecting memory modules to be tested. Also, internal buses IB0, IB1 and IB2 are internal buses which are not connected to the exterior and are used at the time of normal operation.

In the present embodiment, the test of the memory modules of the command memory VRAM and the drawing memories FB0 and FB1 and the test of the drawing processor GP are performed in independent forms. The test of the memory modules is conducted by a memory tester, and the test of the drawing processor GP is conducted by a logic tester.

Also, the memory module in the present embodiment is provided with a normal port NP used at the time of normal operation and a test port TP used at the time of test operation. This construction is used for lightening the load of the port to the minimum at the time of normal operation since control logics such as a memory control are connected to the normal port NP side through the internal buses IB0, IB1 and IB2. However, it is not necessarily required that the normal port and the test port should be provided separately. The normal port and the test port can be constructed with one port by employing a construction such as multiplex.

The test of each module is performed by selecting the image processor GP and the memory modules of the command memory VRAM and the drawing memories FB0 and FB1 are respectively selected by module selecting signals TEM0~5 and a mode selecting signal TL which are internal control signals outputted from the mode selecting terminal MST. Input signals TE0~3 of the mode selecting terminal MST are supplied from an external test device (or tester) or an external CPU. Accordingly, the input signals TE0~3 from the exterior generate the module selecting signals TEM0~5 and the mode selecting signal TL internally through the mode selecting terminal MST and the generated signals are inputted to the respective modules so that the testing is conducted for each module.

Also, each memory module and the common test bus TB are connected in a wired OR manner so that only the output of a memory module selected by the module selecting signal TEM0~5 is outputted to the common test bus TB.

Thereby, the number of wirings for testing can be reduced and the chip area of the semiconductor integrated circuit device SIC can be reduced.

A specific construction of the normal port NT and the test port TP provided in the memory module of the command memory VRAM and the drawing memories FB0 and FB1 is shown in FIG. 16. The normal port NT and the test port TP are constructed so that they perform operations which are different for a normal operation mode and test modes, respectively.

Figure 16A:
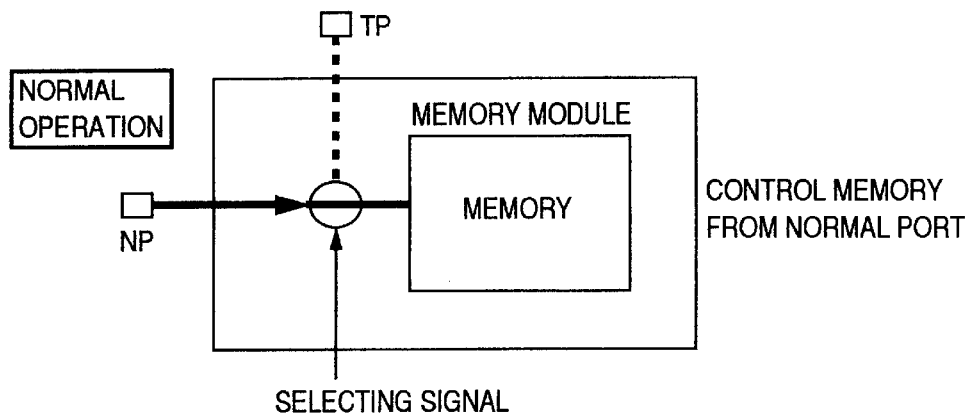
FIGS. 16a–16c show a test function for the memory module incorporated in the semiconductor integrated circuit device according to the present invention.

FIG. 16a shows the case of the normal operation mode in which the semiconductor integrated circuit device SIC is performing a normal operation. In the normal operation mode, the memory module is accessed from the normal port NP by the image processor GP. At this time, the test port TP side is brought into a high-impedance condition on the basis of a selecting signal so that no information is outputted to the exterior. Namely, at the time of normal operation mode, the operation is performed in a state in which the image processor GP and the memory module are directly coupled to each other. The selecting signal is generated by an AND logic of the module selecting signal TEM0–5 and the internal control signal TL.

Figure 16B:
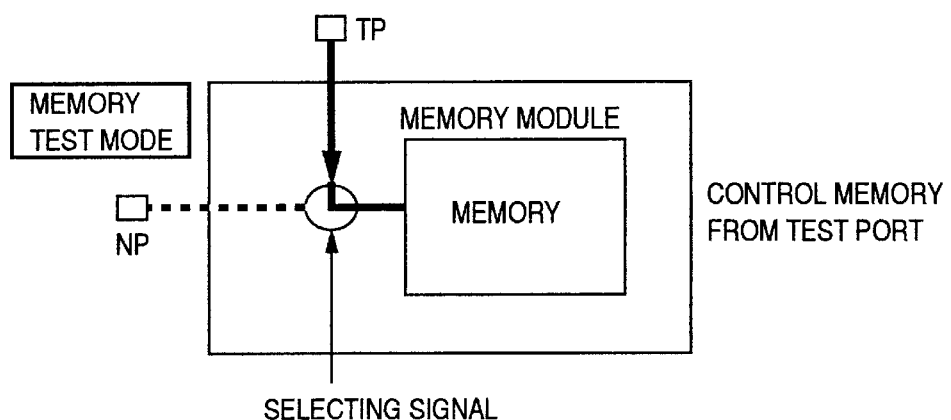

FIG. 16b shows the case of a memory test mode. In the memory test mode, the memory module is accessed from the test port TP. At this time, the normal port NP side is brought into a high-impedance condition on the basis of a selecting signal so that no information is outputted to the exterior. Namely, at the time of memory test mode, the operation is performed in a state in which the image processor GP and the memory module are disconnected and the memory module is directly coupled to the external test device or the external CPU through the test port TP.

Thereby, the conventional test method for semiconductor memories such as general purpose DRAM's can be used for the memory modules mounted on the semiconductor integrated circuit device SIC as it is.

Figure 16C:
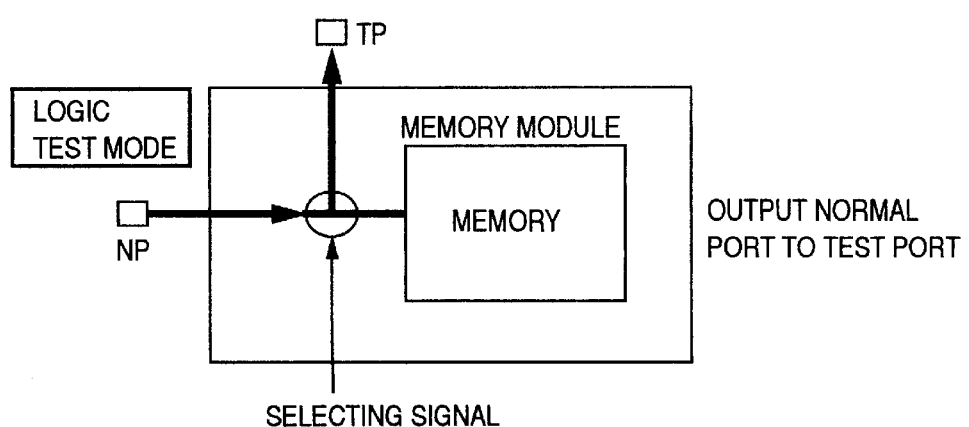

FIG. 16c shows the case of a logic test mode. The logic test mode means a test mode for the image processor GP. In the logic test mode, the memory module is accessed from the normal port NP. Also, the external monitoring through the test port TP is possible.

Namely, at the time of logic test mode, the operation is performed in a state in which the image processor GP and the memory module are directly coupled to each other and the memory module is directly coupled to the external test device or the external CPU through the test port TP. Thereby, at the time of logic test mode, the image processor GP communicates with the memory module in accordance with a test pattern of the logic tester whereas the condition of the memory module at that time can be monitored.

Figure 17:
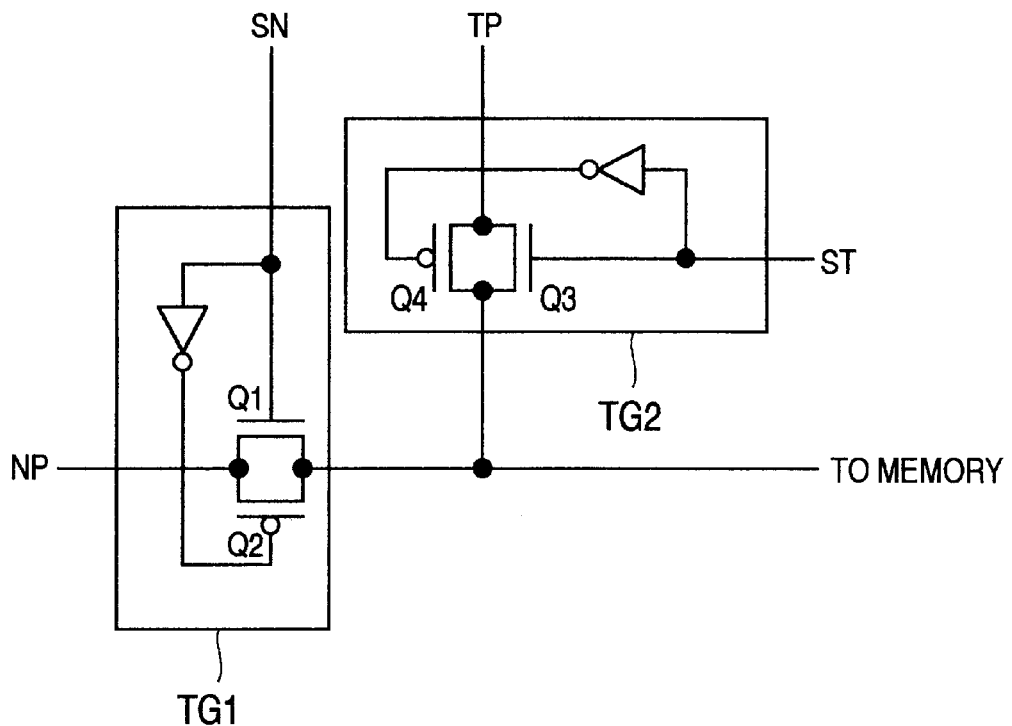
FIG. 17 shows an example of a change-over circuit of the memory module incorporated in the semiconductor integrated circuit device according to the present invention.

FIG. 17 shows an example of a circuit for change-over between the normal port NP and the test port TP. The change-over circuit includes a transfer gate TG1 which is composed of an n-channel MOS (nMOS) transistor Q1 and a p-channel MOS (pMOS) transistor Q2 and a transfer gate TG2 which is composed of an nMOS transistor Q3 and a pMOS transistor Q4. The transfer gates TG1 and TG2 are controlled by control signals SN and ST generated from the mode selecting signal TL and the module selecting signals TEM0 to TEM5. A similar function can be realized using a clock inverter or the like in place of the transfer gate.

FIG. 18 shows the allotment of test control pins of the mode selecting terminal MST. The test control pins (TE0 to TE3) receive a 4-bit encoded signal so that the internal control signals TEM0–5 and the mode selecting signal TL are generated on the basis of the 4-bit encoded signal, as shown in FIG. 18.

The memory modules of the command memory VRAM and the drawing memories FB0 and FB1 are selected and tested on the basis of the module selecting signals TEM0–5 and the mode selecting signal TL.

The internal control signals TEM are the result of decoding of an external input signal supplied to the test control pins (TE0 to TE3) and are inputted to the respective modules of the image processor GP, the command memory VRAM and the drawing memories FB0 and FB1 to determine a module to be tested. In the present embodiment, the signals will be "000000" at the time of normal mode operation and at the time of STNBY mode.

The mode selecting signal TL sets each of modes including a normal operation mode, a logic test mode and a memory test mode. In FIG. 18, the normal operation mode and the logic test mode are set when the mode selecting signal TL is "1". The memory test mode is set when the mode selecting signal TL is "0". In the present embodiment, a stand-by mode can also be set in addition to the normal operation mode, the logic test mode and the memory test mode.

The test module in the present embodiment is such that the test is performed in units of two memory modules (M0–M1, M2–M3, M4–M5) and the test in the memory test mode is performed in units of one memory module (M0, M1, M2, M3, M4, M5). This is based on a difference in test method between the logic test mode and the memory test mode. At the time of logic test mode, the testing is conducted in units of one function such as the drawing memory FB0 or the drawing memory FB1. At the time of memory test mode, on the other hand, the testing is conducted in units of one memory module.

With the above construction, there is no need to increase the number of test control pins (TE0 to TE3) even if the number of mounted memory modules or banks is increased. Also, it becomes possible to test a module(s) corresponding to each test method.

It is not necessarily required that the test control pins (TE0 to TE3) should be encoded as in the present embodiment. There may be employed a construction in which each test control pin selects a specified memory module directly. For example, there may be constructed such that if TE2 turns into "1", one memory module of the drawing memory FB0 is selected and tested.

Figure 19:
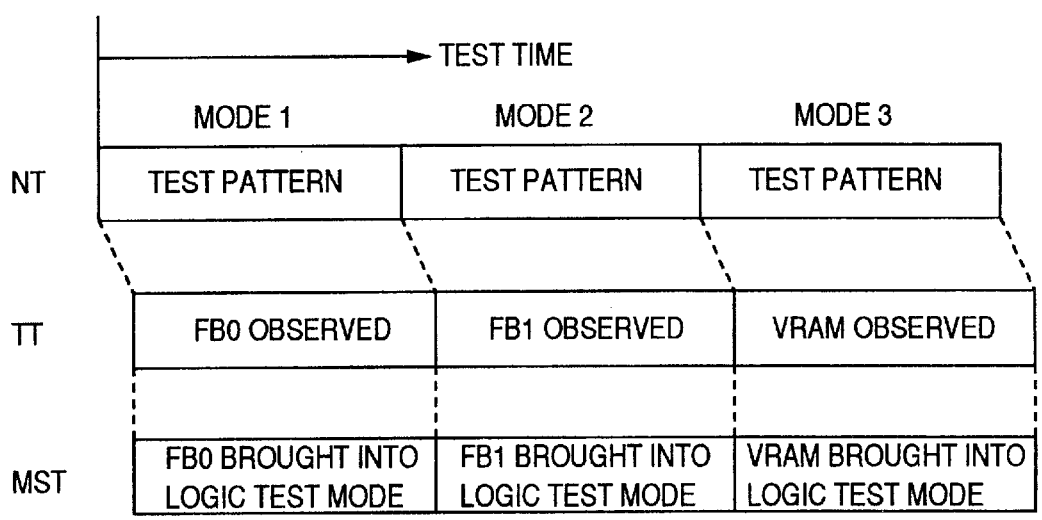
FIG. 19 shows the input/output of each test terminal of the semiconductor integrated circuit device according to the present invention at the time of logic test.

FIG. 19 shows the input/output of each terminal at the time of logic test mode shown in FIG. 16(a).

In the present embodiment, therefore, a state directly coupled to the external test device or the external CPU is established through the test port NP shown in FIG. 16 and the testing can be conducted for the image processor GP and each memory module accessed by the image processor GP, as shown in FIG. 19.

The testing of the image processor GP in the present embodiment is conducted in a manner that the image processor GP executes a command and a test pattern for testing inputted from the exterior from the normal terminal NT. Accordingly, the image processor GP can use the normal terminal NT to perform a normal operation on the basis of the test pattern. This is not different from the operation at the time of normal operation.

More particularly, the testing of the image processor GP is conducted in such a manner that an external data processing device stores the command and the test pattern for testing into the command memory VRAM through the above-mentioned CPU interface unit CIU and the image processor GP executes that command on the basis of an instruction from the external data processing device.

In the present embodiment, the image processor GP executes the test pattern for each memory module to be tested. Accordingly, the drawing memory FB0 is first made the object of logic test mode and the drawing memory FB1 and the command memory VRAM are subsequently made the objects of logic test mode. Which one of the memory modules should be observed in the logic test mode is determined by the observation change-over signals KS which are the result of decoding of external input signals inputted to the test control pins (TE0~TE3). In the present embodiment, there are a mode 1 in which the drawing memory FB0 is observed, a mode 2 in which the drawing memory FB1 is observed and a mode 3 in which the command memory VRAM is observed.

With this construction, a state in which the drawing memory FB0 is being accessed from the normal port NP, a state in which the drawing memory FB1 is being accessed and a state in which the command memory VRAM is being accessed, can be monitored at the time of mode 1, at the time of mode 2 and at the time of mode 3, respectively, from the exterior through the test port TP shown in FIG. 16c.

Figure 20:
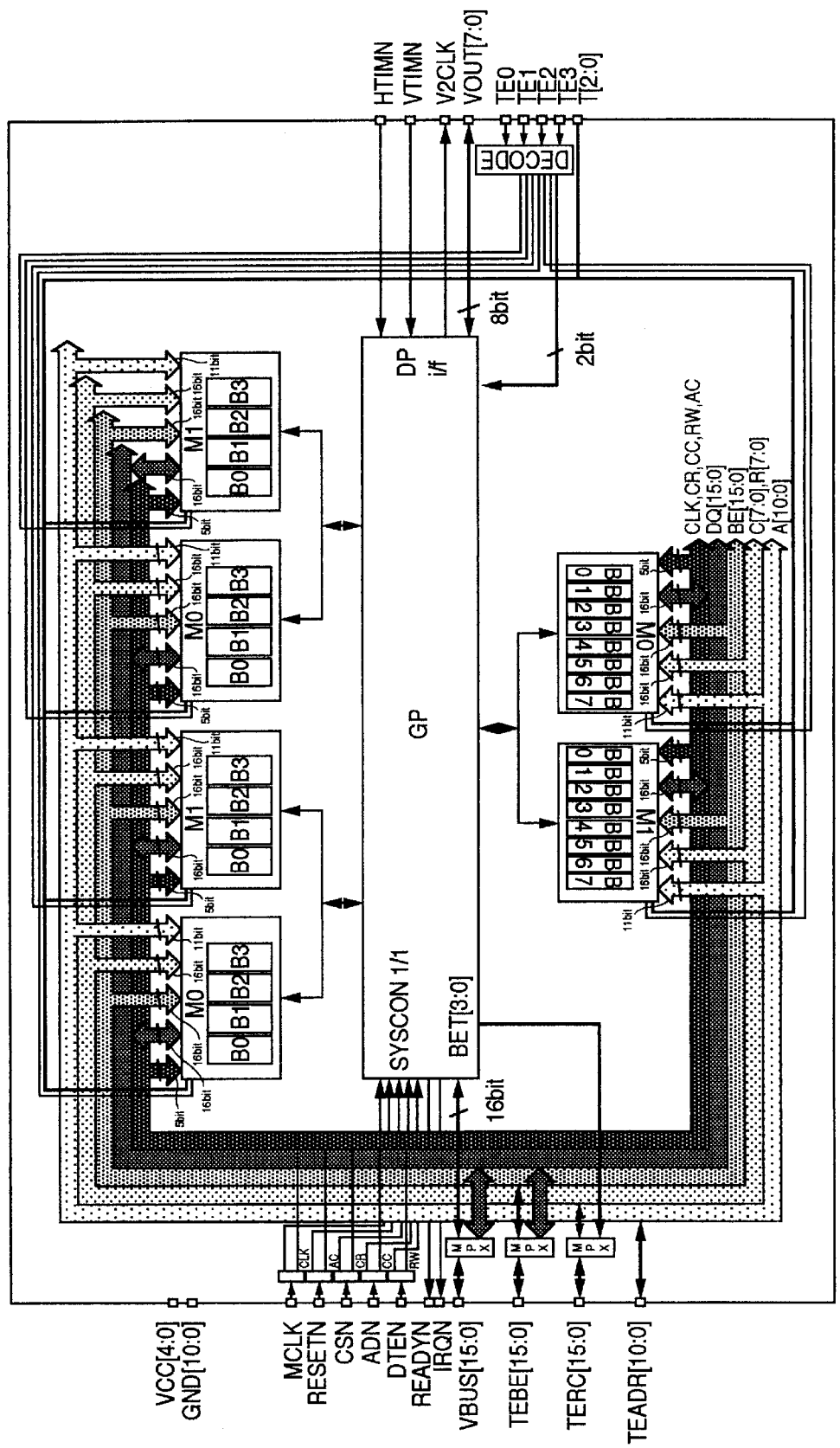
FIG. 20 shows a block diagram of the whole of the semiconductor integrated circuit device according to the present invention.

FIG. 20 shows a block diagram of the whole of the semiconductor integrated circuit device SIC with a view to test, and FIGS. 21 to 23 show a summarized form of the contents of input/output pins of the semiconductor integrated circuit device SIC.

Each memory module is connected to the common test bus TB. The common test bus TB is composed of a 11-bit address bus A, a 8-bit column address bus C, a 8-bit row address bus R, a 16-bit memory byte enable signal BE, a 16-bit data bus DQ, clock CLK, active control AC, row address control CR, column address control CC, read/write RW, and so forth.

The semiconductor integrated circuit device SIC has 100 input, output and input/output terminals in total, that is, 34 input, output and input/output terminals necessary for the image processor GP at the time of normal operation, 7 terminals for test control, 43 terminals for the exclusive use for testing, and 16 power supply/ground terminals. As shown in FIG. 12, twenty five terminals are arranged for each side.

Each of an address/data bus VBUS, a memory byte enable TEBE and a memory bank address TERC is multiplexed in order to reduce the number of pins. For example, the address/data bus VBUS performs as an address/data bus the reading/writing for the image processor GP from the external data processing device at the time of normal operation on one hand and is connected to the data bus DQ of the test bus TB at the time of memory test mode on the other hand to effect the input/output of the contents of the data bus DQ of the test bus TB.

Effects obtained by the present embodiment can be explained briefly as follows.

(1) According to the present embodiment, the optimum arrangement along the flow of information is provided in the case where a frame buffer, a command memory and an image processor are incorporated in one chip. Thereby, the drawing-around of wiring is simplified and the wiring length can be shortened. As a result, the wiring area is reduced, thereby making it possible to reduce the chip area. Further, since the wiring length is shortened, signal delay becomes small, thereby enabling a high-speed operation.

(2) With a construction in which an image processing device having a frame buffer, a command memory and an image processor incorporated in one chip is provided with a test terminal and each memory module is provided with a test port connected to a test bus, it is possible to monitor the content of each incorporated memory module from the exterior at the time of test. Accordingly, even if external terminals for memories are removed due to mixed mounting, the conventional test method can be used as it is.

(3) With a construction in which each of the frame buffer and the command memory incorporated in the image processing device is formed by a plurality of memory modules having the same construction and the same row address is allotted to each memory module, it is possible to increase the memory address depth. Thereby, even in the case where the current line or current capacity of the memory module is limited due to physical restrictions such as stress, torsion and so forth, a frame buffer and a command memory each having a large capacity when seen from the image processor can be realized by the plural and same construction in a range in which the upper limit is satisfied. Further, the construction of the frame buffer and the command memory by memory modules having the same construction enables the unification of testing and/or refreshing in each of the frame buffer and the command memory.

(4) With a construction in which the latencies of reading and writing operations for each of the frame buffer and the command memory based on an instruction from the image processor are made equal to each other, it is possible to facilitate the control logic of a state machine of a logic. Namely, the image processor makes the latencies of reading and writing operations equal to each other by executing a non-operation instruction after the output of a write address. Thereby, it is possible to handle a read processing and a write processing without discrimination in the state machine. Accordingly, there is no need to consider the access combinations of read/write, write/read, read/read and write/write in the state machine. Also, it is possible to reduce the number of logic gates of the image processor.

Industrial Applicability

The present invention can be introduced to an architecture such as a personal computer or an amusement equipment for realizing a high-speed graphic processing. With a construction in which the optimum arrangement along the flow of information is provided in the case where a frame buffer, a command memory and an image processor are incorporated in one chip in order to improve the drawing performance of an image processing device or with a construction in which the conventional memory test and logic test can be used as they are and each of a frame buffer and a command memory is formed by a plurality of memory modules having the same construction, the present invention is suitable for the reduction of an occupied area on a substrate or the realization of an image processing device in which convenient use is possible.

What is claimed is:

1. A semiconductor integrated device, comprising:
    first and second image memories each of which having a relatively large latency of read operation and a relatively small latency of write operation; and
    an image processor to read source data and dot data from the first and second image memories respectively;
    wherein the first and second image memories are simultaneously refreshed, and a cycle of refresh is based on the first image memory, and
    wherein the image processor, the first and second image memories are incorporated in a single chip.

2. A semiconductor integrated device according to claim 1, wherein:

source data is read from the first image memory during a first period of time after a row address is taken in the first image memory, dot data is read from the second image memory during the first period of time after the row address is taken in the second image memory, and the source data and the dot data are synthesized by the image processor during a second period of time to output an address signal and a control signal, thereby performing the writing into the second image memory.

3. A semiconductor integrated device according to claim 2, wherein the first and second image memories correspond to first and second dynamic random-access-memories (RAMs) each of which has image information stored therein.

4. A semiconductor integrated device according to claim 3, wherein a number of refresh cycles and a number of refresh clocks of each of the first and second dynamic RAMs are fixed in the image processor with reference to the first dynamic RAM, thereby unifying the refreshing of the plurality of dynamic RAMs.

5. A semiconductor integrated device according to claim 2, wherein the image processor issues one or more row addresses in a pipe-line fashion, and issues one or more column addresses continuously.

6. A semiconductor integrated device, comprising:

a substrate;

first and second image memories formed on the substrate, each of which having a relatively large latency of read operation and a relatively small latency of write operation; and an image processor formed on the same substrate, to control operation of the first and second image memories respective, including processing source data and dot data from the first and second image memories respectively;

wherein the first and second image memories are simultaneously refreshed, and a cycle of refresh is based on the first image memory.

7. A semiconductor integrated device according to claim 6, wherein:

source data is read from the first image memory during a first period of time after a row address is taken in the first image memory, dot data is read from the second image memory during the first period of time after the row address is taken in the second image memory, and the source data and the dot data are synthesized by the image processor during a second period of time to output an address signal and a control signal, thereby performing the writing into the second image memory.

8. A semiconductor integrated device according to claim 7, wherein the first and second image memories correspond to first and second dynamic random-access-memories (RAMs) each of which has image information stored therein, and wherein a number of refresh cycles and a number of refresh clocks of each of the first and second dynamic RAMs are fixed in the image processor with reference to the first dynamic RAM, thereby unifying the refreshing of the dynamic RAMs.

9. A semiconductor integrated device according to claim 8, wherein the image processor issues one or more row addresses in a pipe-line fashion, and issues one or more column addresses continuously.

* * * * *

UNITED STATES PATENT AND TRADEMARK OFFICE
CERTIFICATE OF CORRECTION

PATENT NO. : 6,744,437 B2
APPLICATION NO. : 10/284153
DATED : June 1, 2004
INVENTOR(S) : Yamagishi et al.

It is certified that error appears in the above-identified patent and that said Letters Patent is hereby corrected as shown below:

Related U.S. Application Data

(62)   Division of application No. 09/961,262, filed on Sep. 25, 2001, which is a division of application NO. 09/142,923, filed on Sep. 18, 1998, now Pat. No. 6,295,074, which is U.S. national phase procedure of PCT application No. PCT/JP96/00730 filed on Mar. 21, 1996.

Signed and Sealed this

Fifth Day of September, 2006

JON W. DUDAS
*Director of the United States Patent and Trademark Office*